(12) United States Patent
Shih

(10) Patent No.: US 7,133,313 B2
(45) Date of Patent: *Nov. 7, 2006

(54) OPERATION SCHEME WITH CHARGE BALANCING FOR CHARGE TRAPPING NON-VOLATILE MEMORY

(75) Inventor: Yen-Hao Shih, Changhua (TW)

(73) Assignee: Macronix International Co., Ltd., Hsinchu (TW)

( * ) Notice: Subject to any disclaimer, the term of this patent is extended or adjusted under 35 U.S.C. 154(b) by 126 days.

This patent is subject to a terminal disclaimer.

(21) Appl. No.: 10/875,623

(22) Filed: Jun. 24, 2004

(65) Prior Publication Data

US 2005/0237801 A1    Oct. 27, 2005

Related U.S. Application Data

(60) Provisional application No. 60/566,669, filed on Apr. 30, 2004, provisional application No. 60/565,377, filed on Apr. 26, 2004.

(51) Int. Cl.
*G11C 11/34* (2006.01)
*G11C 16/04* (2006.01)

(52) U.S. Cl. .................. 365/185.18; 365/185.24; 365/185.28; 365/185.29; 365/185.3

(58) Field of Classification Search ......... 365/185.18, 365/185.24, 185.28, 185.29; 376/185.3
See application file for complete search history.

(56) References Cited

U.S. PATENT DOCUMENTS

| 4,959,812 A | 9/1990 | Momodomi et al. |
| 5,270,969 A | 12/1993 | Iwahashi |
| 5,278,439 A | 1/1994 | Ma et al. |
| 5,355,464 A | 10/1994 | Fandrich et al. |
| 5,408,115 A | 4/1995 | Chang |
| 5,424,569 A | 6/1995 | Prall |
| 5,428,568 A | 6/1995 | Kobayashi et al. |
| 5,448,517 A | 9/1995 | Iwahashi |
| 5,483,486 A | 1/1996 | Javanifard et al. |
| 5,485,422 A | 1/1996 | Bauer et al. |
| 5,509,134 A | 4/1996 | Fandrich et al. |
| 5,515,324 A | 5/1996 | Tanaka |
| 5,566,120 A | 10/1996 | D'Souza |
| 5,602,775 A | 2/1997 | Vo |
| 5,602,789 A | 2/1997 | Endoh et al. |

(Continued)

FOREIGN PATENT DOCUMENTS

JP     09162313     6/1997

(Continued)

OTHER PUBLICATIONS

Tsai, Wen Jer et al., Taiwan Patent Application No. 91120417, filed on Sep. 9, 2002 (TW counterpart to U.S. Appl. No. 10/289,866 below), 24 pages.

(Continued)

*Primary Examiner*—Richard Elms
*Assistant Examiner*—Toan Le
(74) *Attorney, Agent, or Firm*—Mark Haynes; Haynes Beffel & Wolfeld

(57) ABSTRACT

A memory cell with a charge trapping structure has multiple bias arrangements. Multiple cycles of applying the bias arrangements lowering and raising a threshold voltage of the memory cell leave a distribution of charge in the charge trapping layer. The charge interferes with the threshold voltage achievable in the memory cell. This distribution of charge is balanced by applying a charge balancing bias arrangement at intervals during which a plurality of program and erase cycles occurs. Also, the charge balancing bias arrangement is applied prior to the beginning of program and erase cycles of the memory cell.

86 Claims, 30 Drawing Sheets

U.S. PATENT DOCUMENTS

| | | | |
|---|---|---|---|
| 5,644,533 | A | 7/1997 | Lancaster et al. |
| 5,694,356 | A | 12/1997 | Wong et al. |
| 5,745,410 | A | 4/1998 | Yiu et al. |
| 5,768,192 | A | 6/1998 | Eitan |
| RE35,838 | E | 7/1998 | Momodomi et al. |
| 5,895,949 | A | 4/1999 | Endoh et al. |
| 5,966,603 | A | 10/1999 | Eitan |
| 6,011,725 | A | 1/2000 | Eitan |
| 6,023,423 | A | 2/2000 | Aritome |
| 6,034,896 | A | 3/2000 | Ranaweera et al. |
| 6,067,251 | A * | 5/2000 | Hirano .................. 365/185.18 |
| 6,074,917 | A | 6/2000 | Chang et al. |
| 6,075,727 | A | 6/2000 | Morton et al. |
| 6,096,603 | A | 8/2000 | Chang et al. |
| 6,172,907 | B1 | 1/2001 | Jenne |
| 6,194,272 | B1 | 2/2001 | Sung |
| 6,215,148 | B1 | 4/2001 | Eitan |
| 6,219,276 | B1 | 4/2001 | Parker |
| 6,297,096 | B1 | 10/2001 | Boaz |
| 6,320,786 | B1 | 11/2001 | Chang et al. |
| 6,363,013 | B1 | 3/2002 | Lu et al. |
| 6,396,741 | B1 | 5/2002 | Bloom et al. |
| 6,436,768 | B1 | 8/2002 | Yang et al. |
| 6,445,617 | B1 | 9/2002 | Sakakibara |
| 6,458,642 | B1 | 10/2002 | Yeh et al. |
| 6,487,114 | B1 | 11/2002 | Jong et al. |
| 6,496,417 | B1 | 12/2002 | Shiau et al. |
| 6,512,696 | B1 | 1/2003 | Fan et al. |
| 6,538,923 | B1 | 3/2003 | Parker |
| 6,552,386 | B1 | 4/2003 | Wu |
| 6,556,481 | B1 | 4/2003 | Hsu et al. |
| 6,566,699 | B1 | 5/2003 | Eitan |
| 6,587,903 | B1 | 7/2003 | Roohparvar |
| 6,614,070 | B1 | 9/2003 | Hirose et al. |
| 6,614,694 | B1 | 9/2003 | Yeh et al. |
| 6,643,181 | B1 | 11/2003 | Sofer et al. |
| 6,643,185 | B1 | 11/2003 | Wang et al. |
| 6,646,924 | B1 | 11/2003 | Tsai et al. |
| 6,657,894 | B1 | 12/2003 | Yeh et al. |
| 6,670,240 | B1 | 12/2003 | Ogura et al. |
| 6,670,671 | B1 | 12/2003 | Sasago et al. |
| 6,683,811 | B1 | 1/2004 | Ishii et al. |
| 6,690,601 | B1 | 2/2004 | Yeh et al. |
| 6,714,457 | B1 | 3/2004 | Hsu et al. |
| 6,721,204 | B1 * | 4/2004 | Yeh et al. .............. 365/185.24 |
| 6,834,012 | B1 * | 12/2004 | He et al. ................ 365/185.18 |
| 6,836,435 | B1 * | 12/2004 | Li .......................... 365/185.29 |
| 6,912,163 | B1 | 6/2005 | Zheng et al. |
| 6,937,511 | B1 | 8/2005 | Hsu et al. |
| 2002/0167844 | A1 | 11/2002 | Han et al. |
| 2002/0179958 | A1 | 12/2002 | Kim |
| 2003/0036250 | A1 | 2/2003 | Lin et al. |
| 2003/0185055 | A1 | 10/2003 | Yeh et al. |
| 2004/0084714 | A1 | 5/2004 | Ishii et al. |
| 2004/0145024 | A1 | 7/2004 | Chen et al. |
| 2005/0001258 | A1 | 1/2005 | Forbes |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 * | 10/2005 | Lue et al. .............. 365/185.28 |
| 2005/0237816 | A1 | 10/2005 | Lue et al. |
| 2005/0281085 | A1 | 12/2005 | Wu |
| 2006/0039219 | A1 | 2/2006 | Sofer et al. |
| 2006/0044934 | A1 | 3/2006 | Wong et al. |
| 2006/0050562 | A1 | 3/2006 | Cernea et al. |

FOREIGN PATENT DOCUMENTS

| | | |
|---|---|---|
| JP | 11233653 | 8/1999 |
| WO | WO 94/28551 | 12/1994 |

OTHER PUBLICATIONS

Tsai, Wen Jer et al., U.S. Appl. No. 10/289,866, filed Nov. 6, 2002, entitled "Erasing Method for Non-Volatile Memory," 24 pages.

Bude, J.D., et al. "Secondary Electron Flash—a High Performance, Low Power Flash Technology for 0.35 •m and Below," Electron Devices Meeting, 1997. Technical Digest., International , Dec. 7-10, 1997, 279-282.

Chung, Steve S., "Low Voltage/Power and High Speed Flash Memory Technology for High Performance and Reliability," The 3rd WIMNACT—Singapore, Oct. 15, 2003, 1-48.

Chung, Steve S., et al., "A Novel Leakage Current Separation Technique in a Direct Tunneling Regime Gate Oxide SONOS Memory Cell," Electron Devices Meeting, 2003. IEDM '03 Technical Digest. IEEE International , Dec. 8-10, 2003 pp. 26.6.1 - 26.6.4.

De Blauwe, Jan, "Nanocrystal Nonvolatile Memory Devices," IEEE Transactions on Nanotechnology, vol. 1, No. 1, Mar. 2002, 72-77.

Eitan, Boaz, et al. "NROM: A Novel Localized Trapping, 2-Bit Nonvolatile Memory Cell," IEEE Electron Device Letters, vol. 21, No. 11. Nov. 2000, 543-545.

Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, p. 2-3, pulse 24 pages from outline.

Janai, Meir, "Data Retention, Endurance and Acceleration Factors of NROM Devices," IEEE 41st Annual International Reliability Physics Symposium, Dallas, Texas, 2003, 502-505.

Lee, Chang Hyun, et al. "A Novel SONOS Structure of SiO2/SiN. A1203 with TaN Metal Gate for Multi-Giga Bit Flash Memeries," Electron Devices Meeting, 2003, IEDM '03 Technical Digest IEEE International , Dec. 8-10, 2003, 26.5.1-26.5.4.

Lee, Changhyun, et al., "A Novel Structure of SiO2/SiN/High k Dielectrics, A1203 for SONOS Type Flash Memory," Extended Abstracts of the 2002 International Conference on Solid State Devices and Materials, Sep. 17-19, 2002, Nagoya, 162-163.

Lee, Jae-Duk, et al., "Effects of Floating-Gate Interference on NAND Flash Memory Cell Operation," IEEE Electron Device Letters, vol. 23, No. 5, May 2002, 264-266.

Liu, Zhizheng et al., "A New Programming Technique for Flash Memory Devices," International Symposium on VLSI Technology, Systems and Applications, Jun. 8-10, 1999, 195-198.

Huff, H.R. and Bevan, M., assemblers, "Questions at the International Workshop on Gate Insulators," Ad Hoc Meeting on High-k Gate Dielectrics at the Semiconductor Interface Specialists Conference, Nov. 30, 2001, 3 pages.

Shin, Yoocheol, et al., "High Reliable SONOS-type NAND Flash Memory Cell with A1203 for Top Oxide," Non-Volatile Semiconductor Memory Workshop, 2003, 2 pages.

Tsai, W.J., et al., "Data Retention Behavior of a SONOS Type Two-Bit Storage Flash Memory Cell," Electron Devices Meeting, 2001. IEDM Technical Digest. International , Dec. 2-5, 2001 pp. 32.6.1-32.6.4.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International , Dec. 8-10, 2003, pp. 7.4.1-7.4.4.

White, Marvin, H., et al., "On the Go with SONOS," Circuits and Devices Magazine, IEEE , vol. 16 , Issue: 4 , Jul. 2000, pp. 22-31.

Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International, Dec. 8-10, 2003, pp. 7.5.1-7.5.4.

Yeh, C.C., et al., "PHINES: A Novel Low Power Program/Erase, Small Pitch, 2-Bit per Cell Flash Memory," Electron Devices Meeting, 2002. IEDM '02. Digest. International , Dec. 8-11, 2002, pp. 931-934.

Chang, Kuo-Tung, et al., "A New SONOS Memory Using Source-Side Injection for Programming," IEEE Electron Device Letters, vol. 19, No. 7, Jul. 1998, 253-255.

Eitan, Boaz, "Can NROM, a 2-bit, Trapping Storage NVM Cell, Give a Real Challenge to Floating Gate Cells?" SSDM, Tokyo, Japan (1999), 3 pages.

Fujiwara, I., et al., "0.13 μm MONOS single transistor memory cell with separated source lines," IEDM 1998, 995-998.

Kobayashi, T., et al., A Giga-Scale Assist-Gate (AG)-AND-Type Flash Memory Cell with 20-MB/s Programming Troughout for Content-Downloading Applications, IEDM 2001, 2.2.1-2.2.4.

Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electron injection Utilizing subthreshold slope of the localized charge storage NROM memory device," Non-Volatile Semiconductor Memory Workshop, Monterey, CA (Aug. 2001) 2 pages.

Naruke, K., et al., "A new Flash-Erase EEPROM Cell with a Sidewall Select-Gate on its Source Side," Nonvolatile Semiconductor Memories: Technologies, design and application, C. Hu. Ed., New York, IEEE Press, 1991, Ch. 5, pp. 183-186.

Sasago, Y, et al., "90-nm-node multi-level AG-AND type flash memory with cell size of true 2 F2/bit and programming throughput of 10 MB/s," IEEE, 2003, 4 pages.

U.S. Appl. No. 11/118,839, filed Apr. 29, 2005, "Inversion Bit Line, Charge Trapping Non-Volatile Memory and Method of Operating Same," 34 pages.

U.S. Appl. No. 11/085,444, filed Mar. 21, 2005, entitled "Method for Manufacturing a Multiple-Gate Charge Trapping Non-Volatile Memory," 71 pages.

U.S. Appl. No. 10/855,286, filed May 26, 2004, entitled "NAND-Type Non-Volatile Memory Cell and Method for Operating Same," 15 pages.

U.S. Appl. No. 11/085,458, filed Mar. 21, 2005, entitled "Charge Trapping Non-Volatile Memory and Method for Gate-By-Gate Erase for Same," 73 pages.

U.S. Appl. No. 11/085,325, filed Mar. 21, 2005, entitled "Memory Array Including Multiple-Gate Charge Trapping Non-Volatile Cells," 74 pages.

U.S. Appl. No. 11/085,326, filed Mar. 21, 2005, entitled "Charge Trapping Non-Volatile Memory with Two Trapping Locations per Gate, and Method for Operating Same." 73 pages.

U.S. Appl. No. 11/085,300, filed Mar. 21, 2005, entitled "Charge Trapping Non-Volatile Memory and Method for Operating Same," 73 pages.

Lauiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

Shih et al. "A Novel 2bit/cell Nitride Storage Flash Memory with Greater Than 1M P/E-cycle Endurance" IEEE 2004, pp. 36.3.1-36.3.4.

Cho et al. "Simultaneous Hot-Hole Injection at Drain and Source for Efficient Erase and Excellent Endurance in SONOS Flash EEPROM Cells" IEEE Electron Device Letters, vol. 24, No. 4, Apr. 2003, pp. 260-262.

* cited by examiner

US 7,133,313 B2

OPERATION SCHEME WITH CHARGE BALANCING FOR CHARGE TRAPPING NON-VOLATILE MEMORY

RELATED APPLICATIONS

The present application claims priority to U.S. Provisional Application No. 60/565,377 filed 26 Apr. 2004. The present application also claims priority to U.S. Provisional Application No. 60/566,669 filed 30 Apr. 2004.

BACKGROUND OF THE INVENTION

1. Field of the Invention

The present invention relates to electrically programmable and erasable non-volatile memory, and more particularly to charge trapping memory with a bias arrangement, in addition to threshold voltage raising and lowering operations, that modifies the charge in the memory.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names NROM, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Conventional SONOS devices use ultra-thin bottom oxide, e.g. less than 3 nanometers, and a bias arrangement that causes direct tunneling for channel erase. Although the erase speed is fast using this technique, the charge retention is poor due to the charge leakage through ultra-thin bottom oxide.

NROM devices use a relatively thick bottom oxide, e.g. greater than 3 nanometers, and typically about 5 to 9 nanometers, to prevent charge loss. Instead of direct tunneling, band-to-band tunneling induced hot hole injection (BT-BTHH) can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of electrons in the charge trapping structure. This accumulation of charge occurs because the hole injection point and electron injection point do not coincide with each other, and some electrons remain after the erase pulse. In addition, during the sector erase of an NROM flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious when the technology keeps scaling down.

In addition, charge trapping memory devices capture electrons in a charge trapping layer in both shallow and deep energy levels. Electrons trapped in shallow levels tend to de-trap faster than those electrons in deeper energy level traps. The shallow level electrons are a significant source of charge retention problems. In order to keep good charge retention, deeply trapped electrons are preferred.

Thus, a need exists for a memory cell that can be programmed and erased many times, without suffering increasing the threshold voltage after the erase operation that renders the memory cell inoperable, and which demonstrates improved charge retention and reliability.

SUMMARY OF THE INVENTION

A method of operating a memory cell, and an architecture for an integrated circuit including such a memory cell, are provided having improved endurance and reliability. A charge balancing operation for charge trapping-type memory cells is described. This charge balancing operation includes a bias arrangement inducing E-field assisted electron ejection from the gate to the channel and/or direct tunneling of holes for embodiments with thin bottom dielectrics, balanced by E-field assisted electron injection from the gate to the charge trapping structure, including applying a negative gate voltage relative to the substrate (either by applying a $-V_G$ or a positive substrate voltage $+V_{SUB}$, or a combination of $-V_G$ and $+V_{SUB}$), with ground or a low positive voltage applied to the source and drain. The voltage across from the gate to the substrate in the channel of the memory cell in order to accomplish the charge balancing operation of the present invention in practical time limits is higher than about $-0.7$ V/nanometer and in examples described below about $-1.0$ V/nanometer. Thus, for a memory cell having a gate electrode, a top oxide layer, a charge trapping layer and a bottom oxide layer over a channel, the gate to substrate bias for the charge balancing operation is equal to about the effective oxide thickness of the combination of the top dielectric, charge trapping dielectric and bottom dielectric in nanometers, times about $-0.7$ to $-1.1$ V/nanometer.

During the charge balancing operation, gate injection and electron de-trapping could occur in a manner that tends to establish a dynamic balance or equilibrium state. The gate injected electrons can neutralize hole traps left after a hot hole erase. Therefore, the charge balancing operation offers a strong "electrical annealing" to minimize the damage induced from hot hole injection. Reliability tests also show that this charge balancing operation greatly reduces the charge loss after a large number of program and erase P/E cycles.

A method according to the described technology, comprises lowering the threshold voltage of the memory cell via a first bias arrangement, raising the threshold voltage of the memory cell via a second bias arrangement, and applying to the gate of the memory cell a third bias arrangement, such as a charge balancing pulse, in association with one of the first and second bias arrangements. The third bias arrangement can be considered to cause a first movement of electrons and a second movement of electrons. If the gate has a negative voltage relative to the substrate, the first movement of electrons is from the gate to the charge trapping structure (electron gate injection) and the second movement of electrons is from the charge trapping structure to the substrate (electron ejection to the channel). If the gate has a positive voltage relative to the substrate, the first movement of electrons is from the substrate to the charge trapping structure and the second movement of electrons is from the charge trapping structure to the gate. The rate of the first movement of electrons decreases as the threshold voltage increases, or increases as the threshold voltage decreases. The rate of the second movement of electrons increases as the threshold voltage increases, or decreases as the threshold voltage decreases. These movements of electrons cause the threshold voltage to converge toward a target threshold. The technology also includes a bias arrangement which tends to balance the distribution of charge in the charge trapping layer, when the threshold voltage nears the target threshold, substantially across the length of the channel of the memory cell, as opposed to concentrating the charge on one side of the channel or the other.

Another aspect of the present invention provides an integrated circuit with a substrate, memory cells on the substrate, and controller circuitry coupled to the memory cells. Each memory cell has a threshold voltage and comprises a charge trapping structure, a gate, and source and drain regions in the substrate. The controller circuitry includes logic to lower the threshold voltage via a first bias arrangement, logic to raise the threshold voltage via a second bias arrangement, and logic applying a third bias arrangement. The third bias arrangement causes a first movement of electrons and a second movement of electrons causing the threshold voltage to converge toward a convergence voltage.

Another embodiment provides an integrated circuit with a substrate, memory cells on the substrate, and controller circuitry coupled to the memory cells. Each memory cell has a threshold voltage and comprises a charge trapping structure, a gate, and source and drain regions in the substrate. The controller circuitry includes logic to raise the threshold voltage via a first bias arrangement, and logic responding to a command to lower the threshold voltage by applying a second bias arrangement and a third bias arrangement. Via the second bias arrangement, the threshold voltage of the memory cell is lowered. The third bias arrangement causes a first movement of electrons and a second movement of electrons causing the threshold voltage to converge toward a convergence voltage.

Another embodiment provides an integrated circuit with a substrate, memory cells on the substrate, and controller circuitry coupled to the memory cells. Each memory cell has a threshold voltage and comprises a charge trapping structure, a gate, and source and drain regions in the substrate. The controller circuitry includes logic to apply a first bias arrangement. The first bias arrangement causes a movement of holes, a first movement of electrons, and a second movement of electrons. In the movement of holes, holes move to the charge trapping structure, lowering the threshold voltage of the memory cell. Due to the movements of charge, the threshold voltage converges toward a convergence voltage.

In some embodiments, the third bias arrangement removes holes from the charge trapping structure. For example, a movement of electrons into the charge trapping structure will result in the recombination of trapped holes with electrons moving to the charge trapping structure.

In some embodiments, the charge balancing bias arrangement is applied to add a balanced charge to the charge trapping structure prior to any cycles of raising and lowering the threshold voltage. For example, the addition of electrons raises the threshold voltage of the memory cell prior to any cycles of raising and lowering the threshold voltage. In one embodiment, this raised threshold voltage prior to any cycles of raising and lowering the threshold voltage is lower than the minimum threshold voltage achievable via the first bias arrangement and second bias arrangement. In another embodiment, this raised threshold voltage prior to any cycles of raising and lowering the threshold voltage is lower than the program verify voltage and the erase verify voltage of the memory cell.

Embodiments of the technology described herein include an operating method for memory cell comprising a charge trapping structure. The method includes lowering the threshold of the memory cell via a first bias arrangement and raising the threshold of the memory cell via a second bias arrangement. After an interval of time in which a plurality of threshold voltage raising and lowering cycles occurs or is likely to occur, a third bias arrangement is applied tending to balance the distribution of charge of the charge trapping structure. When applied at intervals, the charge balancing operation includes a relatively long pulse (such as one second in embodiments described below), so that the memory cells achieve equilibrium state, or nearly achieve equilibrium state. The interval of time between charge balancing operations that include applying the third bias arrangement, is determined in a variety of manners as suits the particular implementation. For example, interval can be determined using a timer, causing a charge balancing operation in regular periods of time. Alternatively, interval can be determined using a counter for program an erase cycles. Alternatively, the interval can be determined using other factors indicating the lapse of time during operation of the device, including power on and power off events in the like.

Embodiments of the technology include a method of operating a memory cell that comprises applying a first procedure (typically erase) to establish a low threshold state including a first bias arrangement causing reduction in negative charge in the charge trapping structure, and a second bias arrangement tending to the induce balanced charge tunneling between the gate and the charge trapping structure and between the charge trapping structure in the channel. A second procedure (typically program) is used to establish a high threshold state in the memory cell, including a third bias arrangement that causes an increase in negative charge in the charge trapping structure. In embodiments applying a charge balancing pulse during a procedure for establishing a low threshold state, the charge balancing pulse may not be long enough to achieve equilibrium state, but rather long enough (50 to 100 milliseconds in embodiments described below) to cause some tightening in the threshold, and balancing of charge in the charge trapping structure.

A charge balancing and erase technique described herein can be performed in any sequence, for example in a sequence that starts in response to an erase command that starts an erase operation, such as a sector erase. By applying the charge balancing operation as part of an erase procedure, the operation can be applied using shorter intervals of charge balancing pulses, which do not necessarily achieve the equilibrium state, but rather tend to balance the distribution of charge in the charge trapping structure. For example, a relatively short charge balancing pulse can be applied before the erase, where the charge balancing pulse will tend to cause greater electron ejection current due to the negative charge in the charge trapping structure prior to the hot hole injection, to tighten the erase state Vt distribution, making erase easier. Alternatively, a relatively short charge balancing pulse can be applied after the erase, where the charge balancing pulse will tend to cause greater electron injection because of the more positive charge in the charge balancing structure, to neutralize the hole traps and improve the charge retention.

For NROM-like flash memory devices, sector erase is performed by hot hole erase procedures. In combination with the hot hole erase procedure, an additional charge balancing operation is applied in embodiments of the technology described. Since the charge balancing operation has self-convergent properties, it helps to raise the threshold voltage of the over-erased cell and decrease the threshold voltage of the hard-to-erase cell. Also, tightening of the distribution of the target threshold voltage for the low threshold state across an array of memory cells can be accomplished using the charge balancing operation. For SONOS-type memory cells, FN tunneling is used for erase procedures, in combination with the charge balancing pulse.

An alternative method to combine the charge balancing and hot hole erase is to turn on the junction bias on the source and drain slightly during a negative gate voltage bias arrangement for charge balancing. In this situation, hot hole injection, gate injection and electron de-trapping happen simultaneously. This hybrid erase method also shows good endurance and better reliability properties than that of the conventional hot hole erase method.

Smart erase algorithms are suggested by the present technology. The user can design a suitable sequence of charge balancing and erase to obtain good endurance and reliability. The charge balancing operation based on negative gate tunneling is used in combination with hot hole injection or other bias arrangements, to achieve better erase-state threshold voltage control, and acceptable erase speed. The charge balancing/hot hole erase can converge the threshold voltage for the over-erased cell and the hard-to-erase cell simultaneously.

The charge balancing operation can serve as an electrical annealing step to neutralize hole traps, and thus greatly improve device reliability.

The charge balancing method and erase method can be combined in any sequence during the erase operation, or they can be turned on simultaneously.

Another method embodiment also applies multiple bias arrangements. Via a first bias arrangement, the threshold voltage of the memory cell is raised. In response to a command to lower the threshold voltage, the second bias arrangement and the third bias arrangement are applied. Via the second bias arrangement, the threshold voltage of the memory cell is lowered. The third bias arrangement comprises a charge balancing pulse, which causes the threshold voltage to converge toward a convergence voltage. In some embodiments, in response to a command to lower the threshold voltage, the third bias arrangement is applied after the second bias arrangement. In some embodiments, in response to a command to lower the threshold voltage, the third bias arrangement is applied before the second bias arrangement. In some embodiments, in response to a command to lower the threshold voltage, the third bias arrangement is applied both before and after the second bias arrangement. In yet other embodiments, the charge balancing third bias arrangement is applied at the same time as, and in combination with the second bias arrangement.

Another embodiment provides an integrated circuit with a substrate, memory cells on the substrate, and controller circuitry coupled to the memory cells. Each memory cell has a threshold voltage and comprises a charge trapping structure, a gate, and source and drain regions in the substrate. The controller circuitry includes logic to raise the threshold voltage (program) via a first bias arrangement, and logic responding to a command to lower the threshold voltage (erase) by applying a second bias arrangement and a third bias arrangement. Via the second bias arrangement, the threshold voltage of the memory cell is lowered. The third bias arrangement causes a balancing of charge movement so that the threshold voltage converges toward a target threshold.

In some embodiments, the charge balancing bias arrangement is applied to add charge to the charge trapping structure prior to any cycles of raising and lowering the threshold voltage. For example, the addition of electrons in a balanced distribution in the charge trapping structure of the cell raises the threshold voltage of the memory cell prior to any cycles of raising and lowering the threshold voltage.

A programming algorithm according to embodiments of the technology includes a refill cycle to alter the electron trapping spectrum in the charge trapping structure of the memory devices. A refill cycle includes applying a bias arrangement to increase the negative charge in the charge trapping structure followed by a short charge balancing pulse tending to cause ejection electrons from shallow traps in the charge trapping structure, and repeating them bias arrangement to increase the negative charge in the charge trapping structure. One or more of the refill cycles is applied to increase the relative concentration of electrons in deeper traps in the charge trapping structure, and to maintain the high threshold state which is the target of the program operation. The shallow level electrons tend to de-trap faster than the deeper level electrons. After a short charge balancing pulse, the threshold voltage drops a little, and a reprogram or "refill" of charge is applied to return the device to the original program verify threshold level. Repeated charge balance/refill processes result in a shift of the trapping spectrum towards deep level electrons. This phenomenon is called "spectrum blue shift". The refill processes can greatly improve charge retention, even for devices strongly damaged by large numbers of program and erase cycles. Therefore, the refill process provides an effective operation to improve charge retention in charge trapping memory devices. Furthermore, with the refill method, thinner dielectric layers can be utilized for the bottom dielectric, charge trapping structure and top dielectric without charge loss. Thinner dielectric layers may help scale device sizes downward for charge trapping memory devices.

Another embodiment provides an integrated circuit with a substrate, memory cells on the substrate, and controller circuitry coupled to the memory cells. Each memory cell has a threshold voltage and comprises a charge trapping structure, a gate, and source and drain regions in the substrate. The controller circuitry includes logic to raise the threshold voltage (program) via a refill procedure as described above.

The target threshold of the charge balancing operation depends on a number of factors, including the relative amounts of charge tunneling from the gate to the charge trapping structure through the top dielectric, and from the charge trapping structure to the channel through the bottom dielectric. For a lower target threshold, injection current by electron tunneling from the gate to the charge trapping structure is reduced relative to ejection current by electron tunneling from the charge trapping structure to the channel. The reduction is achieved in embodiments of the technology by inhibiting tunneling in the top dielectric by using a gate material having a relatively high work function.

Other aspects and advantages of the technology presented herein can be understood with reference to the figures, the detailed description and the claims, which follow.

DETAILED DESCRIPTION

Figure 1A:
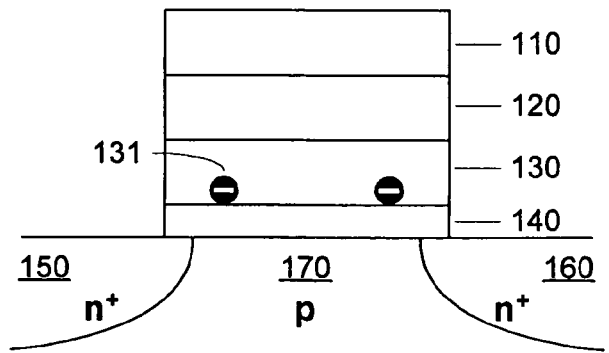
FIG. 1A is a simplified diagram of a charge trapping memory cell prior to any program and erase cycles.

FIG. 1A is a simplified diagram of a charge trapping memory cell. The substrate includes n+ doped regions 150 and 160, and a p-doped region 170 between the n+ doped regions 150 and 160. The remainder of the memory cell includes a bottom dielectric structure 140 on the substrate, a charge trapping structure 130 on the bottom dielectric structure 140 (bottom oxide), a top dielectric structure 120 (top oxide) on the charge trapping structure 130, and a gate 110 on the oxide structure 120. Representative top dielectrics include silicon dioxide and silicon oxynitride having a thickness of about 5 to 10 nanometers, or other similar high dielectric constant materials including for example $Al_2O_3$.

Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others. The charge trapping structure may be a discontinuous set of pockets or particles of charge trapping material, or a continuous layer as shown in the drawing. The charge trapping structure 130 has trapped charge such as represented by electron 131.

The memory cell for NROM-like cells has, for example, a bottom oxide with a thickness ranging from 3 nanometers to 10 nanometers, a charge trapping layer with a thickness ranging from 3 nanometers to 9 nanometers, and a top oxide with a thickness ranging from 5 nanometers to 10 nanometers. The memory cell for SONOS-like cells has, for example, a bottom oxide with a thickness ranging from 1 nanometer to 3 nanometers, a charge trapping layer with a thickness ranging from 3 nanometers to 5 nanometers, and a top oxide with a thickness ranging from 3 nanometers to 10 nanometers.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of the converged cell, as discussed in more detail below with reference to FIG. 1B, is reduced about 2 volts relative to a cell having an n-type polysilicon gate with a silicon dioxide top dielectric.

In the diagram of FIG. 1A, the memory cell has not undergone any program and erase cycles, and the trapped charge is a result of the semiconductor fabrication process, for example. In an array of such memory cells, the amount of charge trapped in the memory cells due to manufacturing processes can vary significantly across the array.

As generally used herein, programming refers to raising the threshold voltage of a memory cell and erasing refers to lowering the threshold voltage of a memory cell. However, the invention encompasses both products and methods where programming refers to raising the threshold voltage of a memory cell and erasing refers to lowering the threshold voltage of a memory cell, and products and methods where programming refers to lowering the threshold voltage of a memory cell and erase refers to raising the threshold voltage of a memory cell.

Figure 1B:
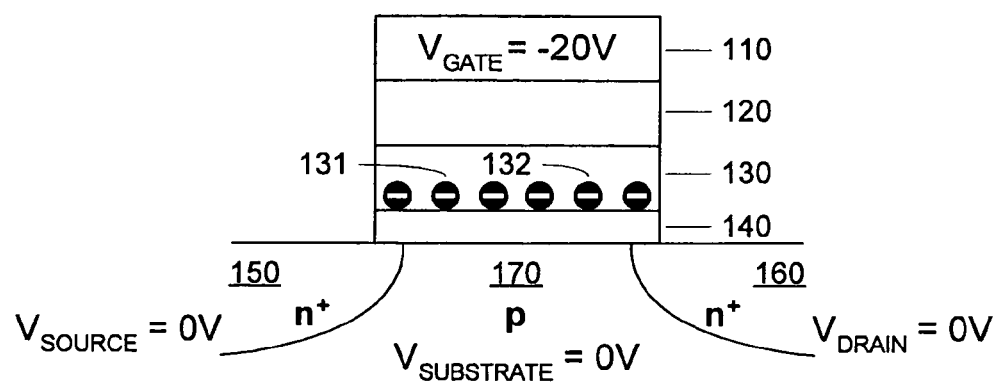
FIG. 1B is a simplified diagram of the charge trapping memory cell of FIG. 1A with a balanced distribution of charge added prior to any program and erase cycles.

FIG. 1B is a simplified diagram of the charge trapping memory cell of FIG. 1A with charge added prior to any program and erase cycles. A potential of 0 V is placed on the source 150, the drain 160, and the substrate 170. A potential of −20 V is placed on the gate 110, which is sufficient to induce an E-field across the bottom oxide of about 0.7 to 1.0 Volts/nm or higher. This bias arrangement tends to balance the charge distribution in the charge trapping structure 130, by inducing both electron injection current from the gate to the charge trapping layer and electron ejection current from the charge trapping structure to the channel, which reaches a dynamic balance or equilibrium after sufficient time, in which the threshold voltage of the memory cell is converged on a target threshold, and which results in a balanced distribution of charge across the length of the channel. This bias arrangement is substantially symmetrical across the channel of the memory cell. This bias arrangement adds charge to the charge trapping structure 130, such as electron 132, when the cell has a small amount of charge before the bias arrangement is applied. However, the amount of charge trapped in a charge trapping structure due to manufacturing induced stress or otherwise before the device is programmed and erased in the field, can vary substantially across an array of memory cells on a single integrated circuit. The bias arrangement of FIG. 1B will tend to balance, and establish an equilibrium in, the amount of charge trapped in memory cells across the array within a reasonable tolerance. The target threshold of the bias arrangement of FIG. 1B depends on the equilibrium condition at which the electron injection current and electron ejection current balance. This equilibrium occurs when the amount of charge in the charge trapping structure is balanced across the channel, and remains substantially constant under the bias condition. The threshold voltage of the memory cell, which is a function of the amount of charge in the charge trapping structure, when the dynamic balance condition is reached depends on the characteristics of the top and bottom oxides, the gate and the charge trapping structure. Conditions favoring electron ejection current over electron injection from the gate tend to lower the target threshold. Lower target thresholds are desirable because they allow lower voltage operations of the memory cell during read. Thus, embodiments of the memory cell employ high work function gate material, such as p+ doped polysilicon, or high dielectric constant top oxide material such as $Al_2O_3$, or both, to achieve a lower target threshold.

The magnitude of the gate-to-substrate bias according to embodiments of a charge balancing pulse is determined with reference to the effective oxide thickness EOT of the dielectric stack, including the top dielectric, the charge trapping structure and the bottom dielectric, when the EOT is the actual thickness as normalized with respect to the permittivity of silicon dioxide. For example, when the top dielectric, charge trapping structure and bottom dielectric comprise silicon dioxide, silicon nitride and silicon dioxide, respectively, the structure is referred to as an ONO stack. For an ONO stack, the EOT is equal to the top oxide thickness, plus the bottom oxide thickness plus the nitride thickness times the oxide permittivity divided by nitride permittivity. Now, the bias arrangement for a charge balancing pulse can be defined for NROM-like and SONOS-like memory cells as follows:

1. NROM-like memory cells for the purpose of this description are cells that have a bottom oxide thickness>3 nm. The dielectric stack has an EOT (10 nm to 25 nm, for example), and the bottom oxide is thicker than 3 nm to prevent direct tunneling of holes from the substrate, and the gate to the substrate bias has a voltage (−12 volts to −24 volts for example), and the voltage divided by EOT is greater than 0.7 V/nm, and preferably about 1.0 V/nm, plus or minus about 10%.

EOT Calculation for ONO in NROM-like cell:

|  | MIN | MAX |
|---|---|---|
| Top OX (permittivity = 3.9) | 5 nm | 10 nm |
| SIN (permittivity = 7) | 3 nm | 9 nm |
| Bottom OX (permittivity = 3.9) | 3 nm | 10 nm |
| SUM | 5 + 3*3.9/ 7 + 3 = 10 (nm) | 10 + 9*3.9/ 7 + 10 = 25 nm |

2. SONOS-like memory cells for the purpose of this description are cells that have a bottom oxide thickness<3 nm. The dielectric stack has an EOT (5 nm to 16 nm, for example), and the bottom oxide is thinner than 3 nm, allowing direct tunneling of holes from substrate. The gate to the substrate bias for SONOS-like cells has a voltage (−5 volts to −15 volts for example), and that voltage divided by the EOT is greater than 0.3 V/nm, and preferably about 1.0 V/nm, plus or minus about 10%.

EOT Calculation for ONO in SONOS-like cell:

|  | MIN | MAX |
|---|---|---|
| Top OX (permittivity = 3.9) | 3 nm | 10 nm |
| SIN (permittivity = 7) | 3 nm | 5 nm |
| Bottom OX (permittivity = 3.9) | 1 nm | 3 nm |
| SUM | 3 + 3*3.9/ 7 + 1 = 5.7 (nm) | 10 + 5*3.9/ 7 + 3 = 15.8 nm |

For materials other than silicon dioxide and silicon nitride in the stack, the EOT is calculated in the same way, normalizing the thickness of the material by a factor of the permittivity of silicon dioxide divided by the permittivity of the material.

Figure 2A:
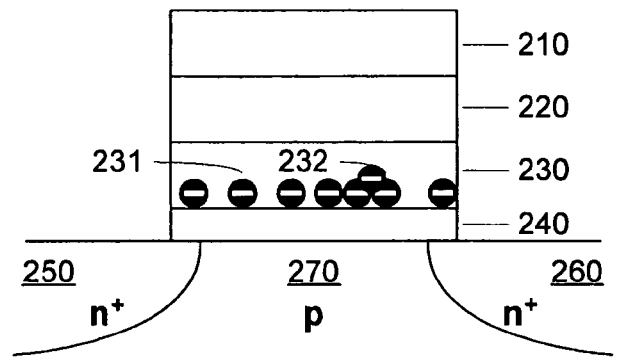
FIG. 2A is a simplified diagram of a charge trapping memory cell following multiple program and erase cycles.

FIG. 2A is a simplified diagram of a charge trapping memory cell following multiple program and erase cycles. The substrate includes n+ doped regions 250 and 260, and a p-doped region 270 between the n+ doped regions 250 and 260. The remainder of the memory cell includes an oxide structure 240 on the substrate, a charge trapping structure 230 on the oxide structure 240, another oxide structure 220 on the charge trapping structure 230, and a gate 210 on the oxide structure 220. The multiple program and erase cycles leave behind trapped charge in the charge trapping structure 230, such as electrons 231 and 232, due to the difference in the bias arrangements used to achieve program and erase, due to which some electrons may be trapped at locations in the charge trapping structure, using channel hot electron injection, that the erasing algorithm, such as band-to-band tunneling induced hot hole injection, is unable to affect.

Figure 2B:
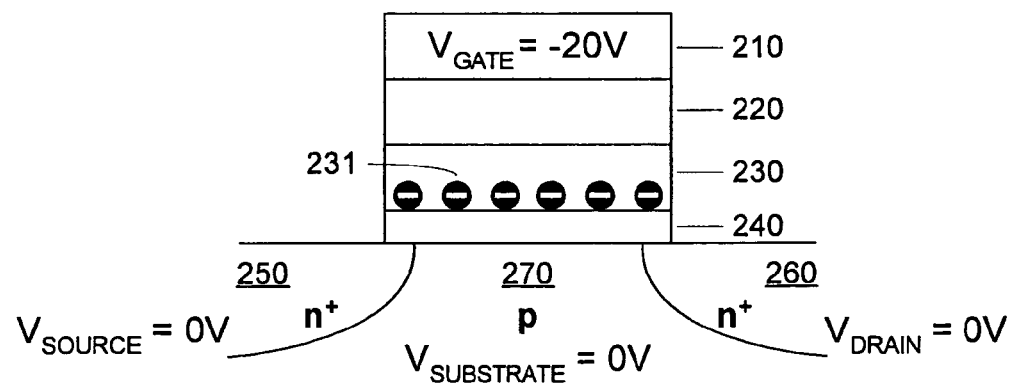
FIG. 2B is a simplified diagram of the charge trapping memory cell of FIG. 2A following a balancing in the distribution of charge.

FIG. 2B is a simplified diagram of the charge trapping memory cell of FIG. 2A following a change in the distribution of charge, and applying a bias arrangement like that described above with reference to FIG. 1B. A potential of 0 V is placed on the source 250, the drain 260, and the substrate 270. A potential of −20 V, in this example, is placed on the gate 210. This bias arrangement tends to balance the charge distribution in the charge trapping structure 230, by removing excess electrons in regions in which the electrons have built up during program and erase cycling, such as electron 232, and by inducing both electron injection current from the gate to the charge trapping layer and electron ejection current from the charge trapping structure to the channel, which reaches a dynamic balance or equilibrium after sufficient time, in which the threshold voltage of the memory cell is converged on a target threshold, and which results in a balanced distribution of charge across the length of the channel. This bias arrangement is substantially symmetrical across the channel of the memory cell.

A method according to the described technology, comprises lowering the threshold voltage of the memory cell via a first bias arrangement, raising the threshold voltage of the memory cell via a second bias arrangement, and applying to the gate of the memory cell a third bias arrangement in association with one of the first and second bias arrangements. The third bias arrangement can be considered to cause a first movement of electrons and a second movement of electrons. If the gate has a negative voltage relative to the substrate, the first movement of electrons is from the gate to the charge trapping structure and the second movement of electrons is from the charge trapping structure to the substrate. If the gate has a positive voltage relative to the substrate, the first movement of electrons is from the substrate to the charge trapping structure and the second movement of electrons is from the charge trapping structure to the gate. The rate of the first movement of electrons decreases as the threshold voltage increases, or increases as the threshold voltage decreases. The rate of the second movement of electrons increases as the threshold voltage increases, or decreases as the threshold voltage decreases. These movements of electrons cause the threshold voltage to converge toward a target threshold. The bias arrangement tends to balance the distribution of charge in the charge trapping layer, when the threshold voltage nears the target threshold, substantially across the length of the channel of the memory cell, as opposed to concentrating the charge on one side of the channel or the other.

FIGS. 3A–3D illustrate a program and erase cycle that leaves behind charge in the charge trapping layer of a memory cell, followed by a change in the distribution of charge.

Figure 3A:
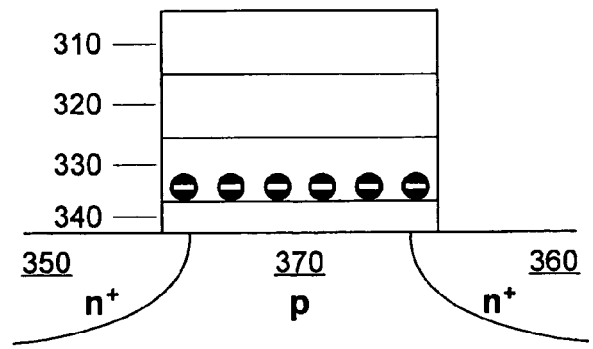
FIG. 3A is a simplified diagram of a charge trapping memory cell following a balancing in the distribution of charge.

FIG. 3A is a simplified diagram of a charge trapping memory cell following a balancing of the distribution of charge. The substrate includes n+doped regions 350 and 360, and a p-doped region 370 between the n+ doped regions 350 and 360. The remainder of the memory cell includes an oxide structure 340 on the substrate, a charge trapping structure 330 on the oxide structure 340, another oxide structure 320 on the charge trapping structure 330, and a gate 310 on the oxide structure 320.

Figure 3B:
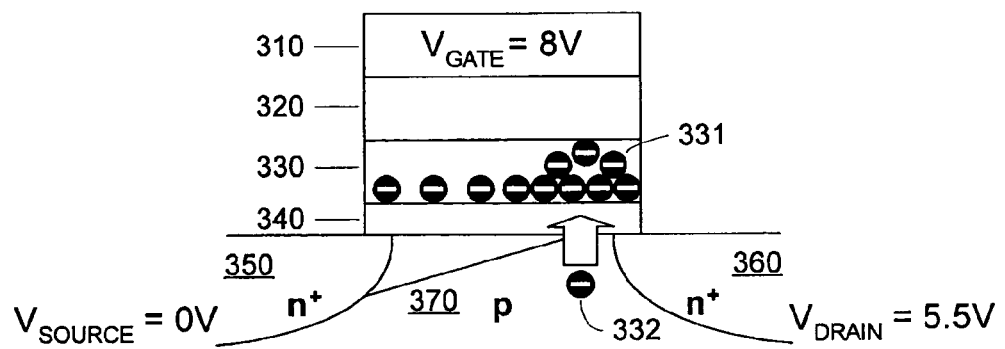
FIG. 3B is a simplified diagram of the charge trapping memory cell of FIG. 3A undergoing channel hot electron injection.
Figure 3C:
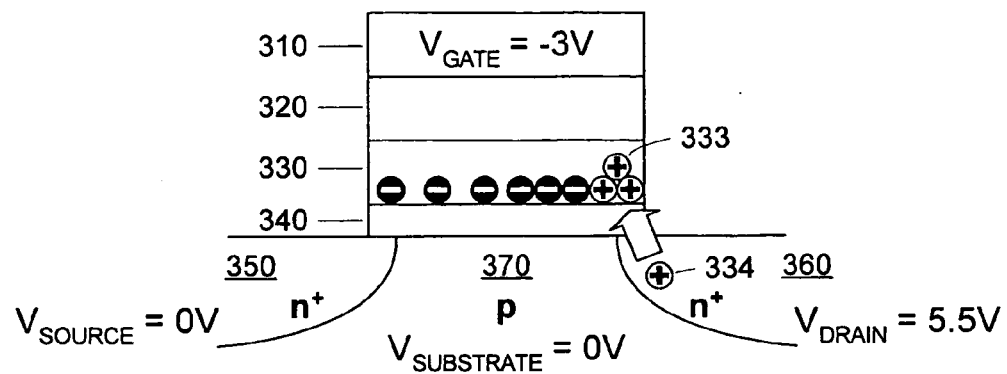
FIG. 3C is a simplified diagram of the charge trapping memory cell of FIG. 3B undergoing band-to-band tunneling hot hole injection.

FIGS. 3B and 3C show examples of bias arrangements that program and erase the memory cell, respectively.

FIG. 3B is a simplified diagram of the charge trapping memory cell of FIG. 3A undergoing channel hot electron CHE injection. A potential of 0 V is placed on the source 350. A potential of 5.5 V is placed on the drain 360. A potential of 8 V is placed on the gate 310. This bias arrangement causes channel hot electrons such as electron 332 to be transported from the channel in p-doped region 370 into the charge trapping structure 330 in a region focused near the drain at which the positive voltage is applied. Electron 331 is an example of charge that has been trapped in the charge trapping structure 330 following injection. Other programming bias arrangements (bias arrangements for establishing a high threshold state, or multiple high threshold states for multibit operation) are applied in other embodiments. Representative program bias arrangements include channel initiated secondary electron injection CHISEL, source side injection SSI, drain avalanche hot electron injection DAHE, pulse agitated substrate hot electron injection PASHEI, and positive gate E-field assisted (Fowler-Nordheim) tunneling, and other bias arrangements.

FIG. 3C is a simplified diagram of the charge trapping memory cell of FIG. 3B undergoing band-to-band tunneling induced hot hole injection. A potential of −3 V is placed on the gate. A potential of 0 V is placed on the source 350. A potential of 5.5 V is placed on the drain 360. A potential of 0 V is placed on the other portion of the substrate 370. This bias arrangement causes hot hole injection via band-to-band tunneling of holes such as 334 to be transported from a region near the drain 360 into the charge trapping structure 330. Hole 333 is an example of charge that has been trapped in the charge trapping structure 330 following injection. The region in which holes are injected to reduce the concentration of electrons in the charge trapping layer does not match perfectly with the region in which electrons are injected. Thus, after a number of program and erase cycles, a concentration of electrons accumulates in the charge trapping structure, which interferes with the ability to achieve a low threshold state, and limits the endurance of the device. Other erase bias arrangements (bias arrangements for establishing a low threshold state) include negative gate E-field assisted tunneling at voltages causing electron ejection without significant electron injection from the gate, direct tunneling of electrons out of, or holes into, the charge trapping structure for thin bottom oxide embodiments, and others.

Figure 3D:
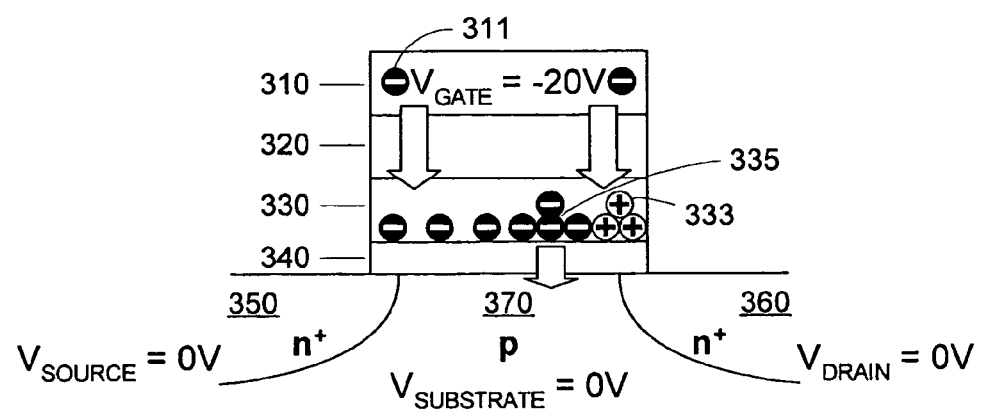
FIG. 3D is a simplified diagram of the charge trapping memory cell of FIG. 3C undergoing a balancing in the distribution of charge.

FIG. 3D is a simplified diagram of the charge trapping memory cell of FIG. 3C, showing a concentration of trapped electrons 335 that is not affected by the injected holes 333, and interferes with the minimum threshold that can be achieved. By applying a charge balancing bias arrangement like that described above with reference to FIG. 1B, tending to balance the distribution of charge, a change in the distribution of charge in the charge trapping layer is achieved which reduces or eliminates the excess trapped charge. In this example, a potential of −20 V is placed on the gate. The potential from the gate to the substrate in the region of the channel is a voltage, which when divided by the EOT of the top dielectric, charge trapping structure and bottom dielectric is greater than 0.7 V/nm, and preferably about 1.0 V/nm, for NROM-like cells and greater than about 0.3 V/nm, and preferably about 1.0 V/nm, for SONOS-like cells. A potential of 0 V is placed on the source 350, the drain 360, and the portion of the substrate 370 in which the channel is formed in this example. This bias arrangement causes a change in the distribution of charge in the charge trapping structure 330. In the change in the distribution of charge, excess charge is removed, and/or electrons are added. Charge such as electron 311 is transported from the gate to the charge trapping structure 330, by a charge movement mechanism such as E-field assisted tunneling. This charge removes trapped holes from the charge trapping structure 330 such as hole 333. Charge such as electron 335 which is trapped in locations that are spaced away from the region in which hot holes are injected, is transported from the charge trapping structure 330 to the p-type region 370, by a charge movement mechanism such as E-field assisted tunneling. In fact, E-field assisted tunneling from the charge trapping layer to the channel can occur under this bias arrangement substantially entirely across the length of the channel. This bias arrangement tends to balance the charge distribution in the charge trapping structure 330, by removing excess electrons in regions in which the electrons have built up during program and erase cycling, such as electron 333, and by inducing both electron injection current from the gate to the charge trapping layer and electron ejection current from the charge trapping structure to the channel, which reaches a dynamic balance or equilibrium after sufficient time, in which the threshold voltage of the memory cell is converged on a target threshold, and which results in a balanced distribution of charge across the length of the channel. This bias arrangement is substantially symmetrical across the channel of the memory cell. If the bias arrangement is applied for a long pulse, on the order of 0.5 to 1.0 seconds, then equilibrium, or near equilibrium, is achieved, and the charge distribution is balanced as illustrated in FIG. 3A for example. If the bias arrangement is applied for a short pulse, on the order of 1 to 50 milliseconds seconds for example, then the charge distribution tends to balance but may not reach the equilibrium state.

Figure 4:
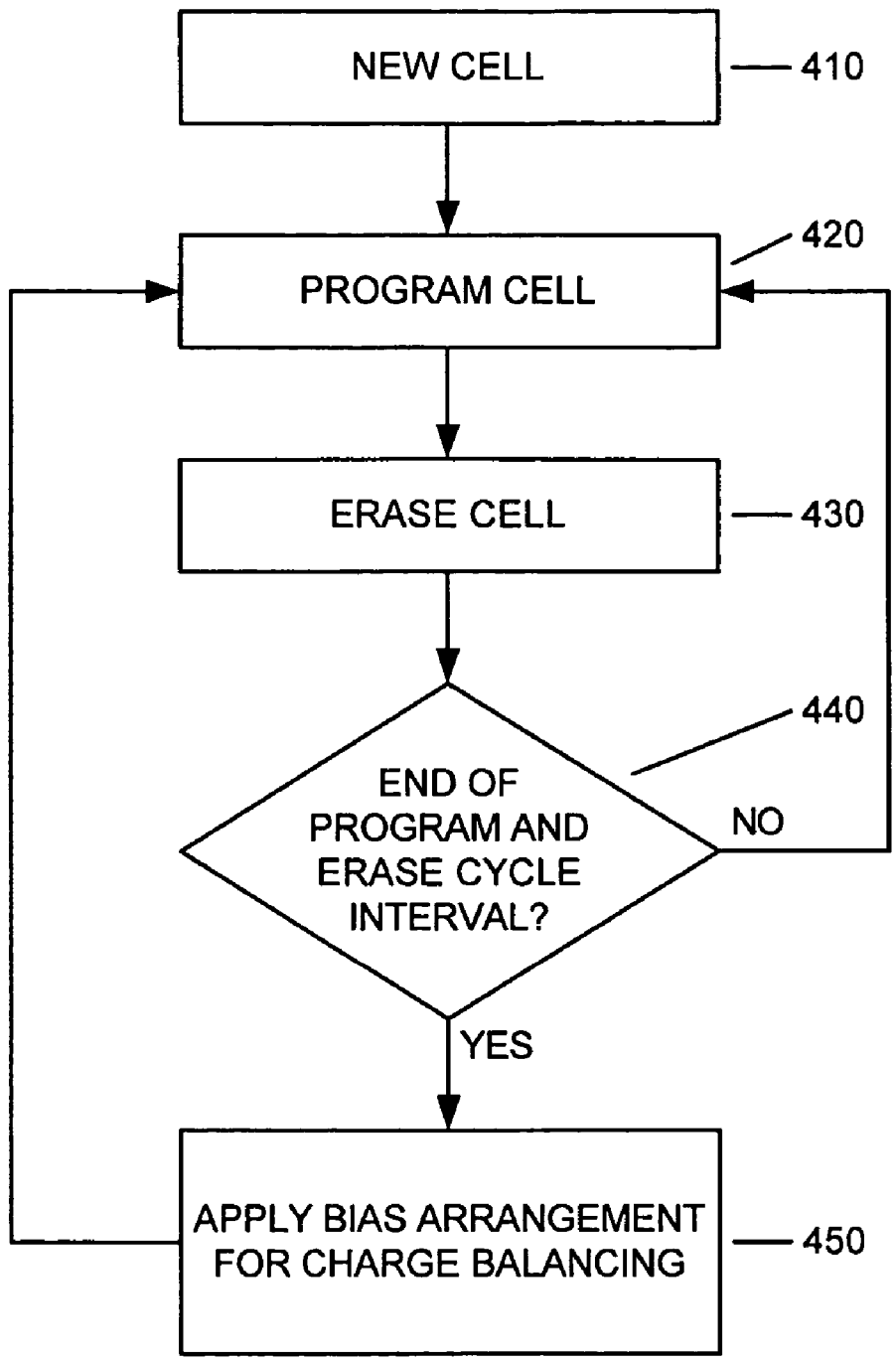
FIG. 4 illustrates a representative process for changing a distribution of charge in a charge trapping memory cell following multiple program and erase cycles.

FIG. 4 illustrates a representative process for changing a distribution of charge in a charge trapping memory cell following multiple program and erase cycles. A new memory cell 410 has not yet experienced any program and erase cycles. At 420 and 430, the memory cell is programmed and erased via first and second bias arrangements. At 440, a determination occurs as to whether the interval of program and erase cycles is over. The interval is determined by counting a number of program and erase cycles. If interval is not yet over, the memory cell is programmed and erased at 420 and 430 again. Otherwise, at 450 the distribution of charge in the memory cell is changed via a third bias arrangement in which the potential from the gate to the substrate in the region of the channel is a voltage, which when divided by the EOT of the top dielectric, charge trapping structure and bottom dielectric is greater than 0.7 V/nm, and preferably about 1.0 V/nm, for NROM-like cells and greater than about 0.3 V/nm, and preferably about 1.0 V/nm, for SONOS-like cells.

In various embodiments, the first bias arrangement and the second bias arrangement each cause one or more of E-field assisted tunneling, hot electron injection such as channel hot electron CHE injection, channel initiated secondary electron CHISEL injection, and/or hot hole injection such as band-to-band tunneling hot hole BTBTHH injection. The charge movement mechanisms may be the same or different among different bias arrangements. However, even if one or more charge movement mechanisms are the same among different bias arrangements, the first bias arrangement, the second bias arrangement, and the third bias arrangement each place a different bias arrangement on the memory cell, each with a distinct combination of voltages on the terminals of the memory cell.

In some embodiments with exemplary specific bias arrangements: the third bias arrangement places a gate of the memory cell at a negative potential relative to a source, drain, and substrate of the memory cell; the first bias arrangement causes hot hole injection and the second bias arrangement causes hot electron injection; the first bias arrangement causes hot hole injection, the second bias arrangement causes hot electron injection, and the third bias arrangement causes E-field assisted tunneling; the first bias arrangement causes hot hole injection, the second bias arrangement causes hot electron injection, and the third bias arrangement places a gate of the memory cell at a negative potential relative to a source, drain, and substrate of the memory cell, which has a magnitude for NROM-like cells greater than about 0.7 V/nm of EOT for dielectric stack, and a magnitude for SONOS-like cells greater than about 0.3 V/nm, and preferably about 1.0 V/nm of EOT for the dielectric stack.

Figure 5:
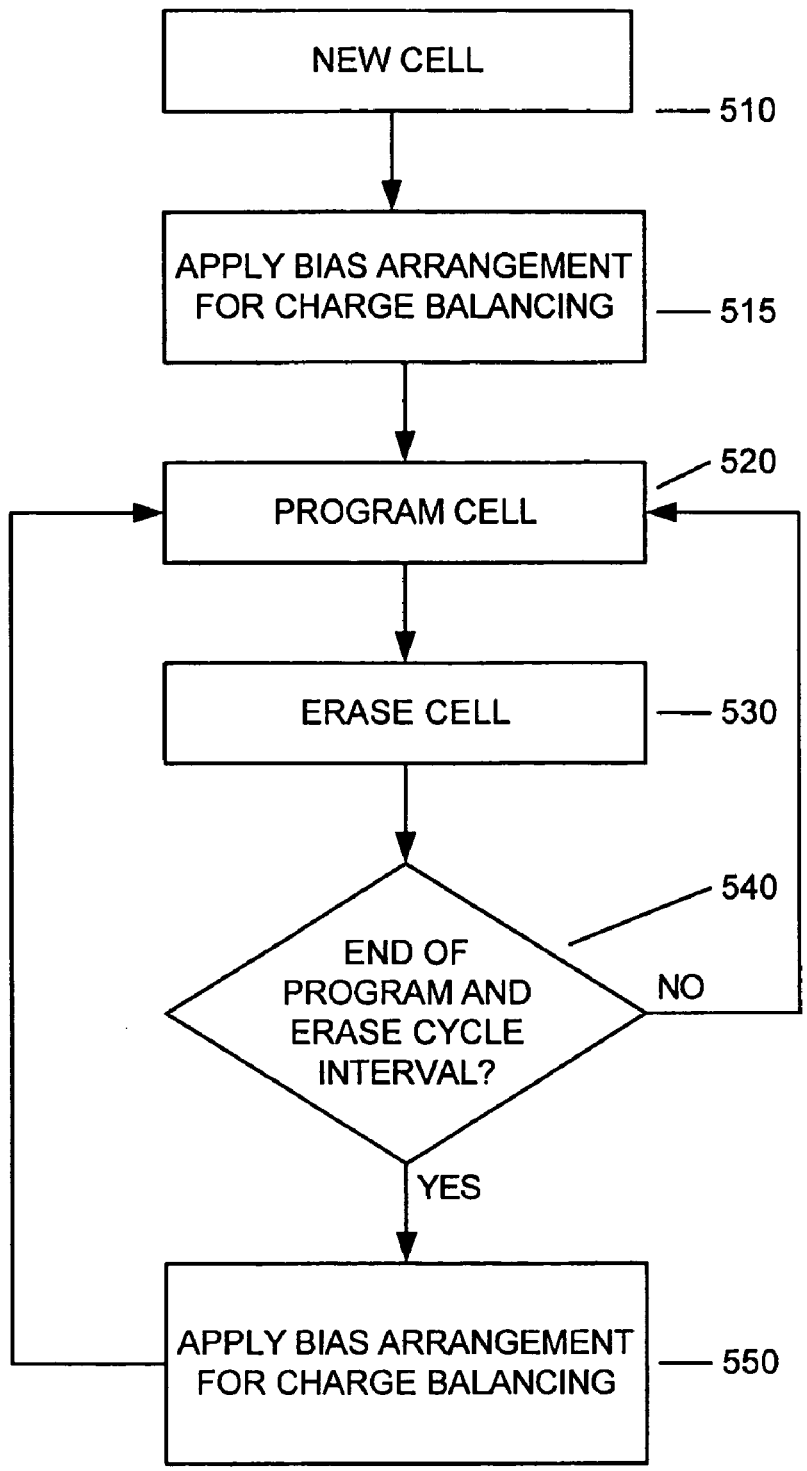
FIG. 5 illustrates a representative process for adding charge to a charge trapping memory cell prior to any program and erase cycles, and changing a distribution of charge in the charge trapping memory cell following multiple program and erase cycles.

FIG. 5 illustrates a representative process for adding charge to a charge trapping memory cell prior to any program and erase cycles, and changing a distribution of charge in the charge trapping memory cell following multiple program and erase cycles. The process is similar to the process of FIG. 4. However, prior to any program and erase cycles at steps 520 and 530, charge is added to the cell at 515 using a charge balancing pulse as described above, thereby raising the threshold voltage achievable in the memory cell via programming and/or erasing. Following the addition of charge at 515, the threshold voltage is less than a threshold voltage in the memory cell following erasing or programming, and is less than program verify and erase verify voltages of the memory cell.

Figure 6:
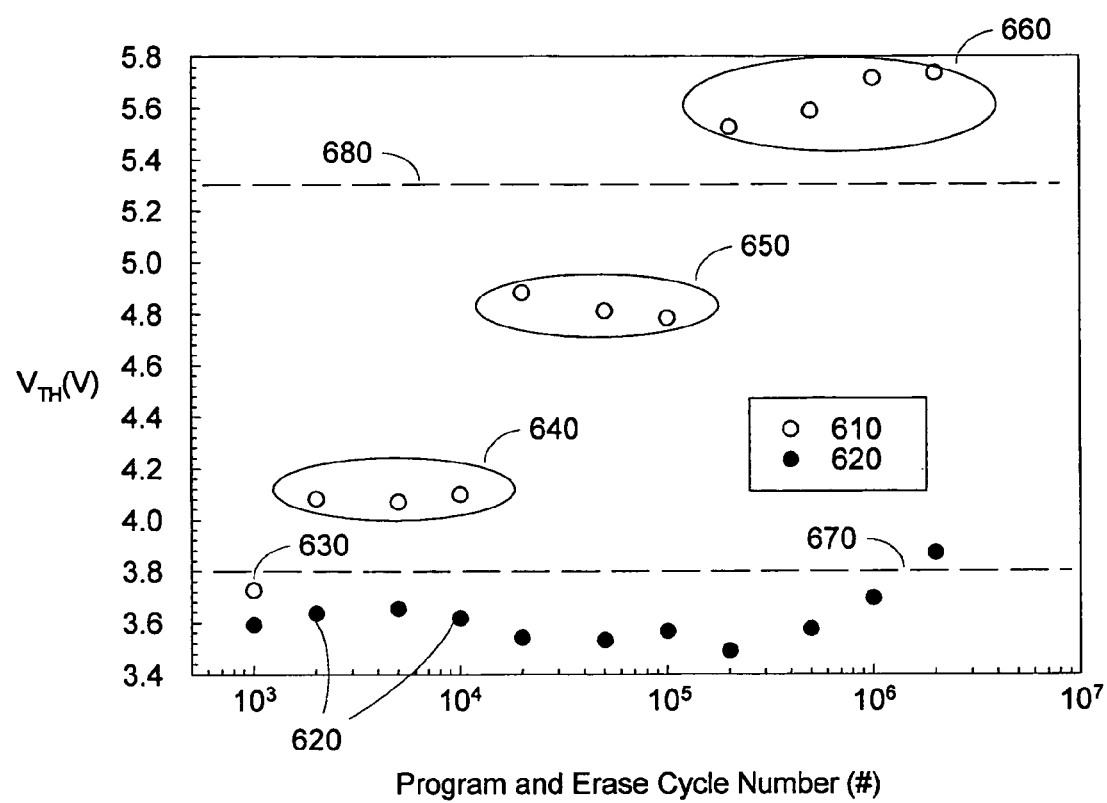
FIG. 6 is a graph of threshold voltage versus the number of program and erase cycles, and compares the threshold voltage of memory cells before and after changing the distribution of charge.

FIG. 6 is a graph of threshold voltage versus the number of program and erase cycles, and compares the threshold voltage of memory cells before and after changing the distribution of charge. Memory cells undergo a different number of program and erase cycles prior to undergoing a change in the distribution of charge in the charge trapping structure. The data points 610 (hollow dot) represent memory cells prior to undergoing a change in the distribution of charge. The data points 610 include data sets 630, 640, 650, and 660. In data set 630, the memory cell undergoes 500 program and erase cycles at a time before each operation to change the distribution of charge. In data set 640, after the first 1,000 program and erase cycles, the memory cell undergoes 1,000 program and erase cycles at a time before each operation to change the distribution of charge. In data set 650, after the first 10,000 program and erase cycles, the memory cell undergoes 10,000 program and erase cycles at a time before each operation to change the distribution of charge. In data set 660, after the first 100,000 program and erase cycles, the memory cell undergoes 50,000 program and erase cycles at a time before each operation to change the distribution of charge. As the number of program and erase cycles increases through data sets 630, 640, 650, and 660, the threshold voltage of the memory cell increases prior to an operation to change the distribution of charge. The data points 620 (solid dot) represent the memory cells after undergoing a change in the distribution of charge using the bias arrangement described above with reference to FIG. 3D. The graph shows that all the data points 610, except for data set 630, exceed the erase verify voltage of 3.8 V indicated by line 670. The data set 660 actually exceeds the program verify voltage of 5.3 V indicated by line 680. Data sets 630, 640, 650, and 660 show varying degrees of interference with a minimum threshold voltage achievable in the memory cell. The data points 620 show that the operation to change the distribution of charge successfully lowers the threshold voltage of the memory cell back below the erase verify voltage line 670, except for the memory cell which has undergone over 1 million program and erase cycles. The graph shows that as the number of program and erase cycles is increased prior to the operation to change the distribution of charge, the amount of interference with a minimum threshold voltage achievable in the memory cell increases. Thus, for the embodiment from which the data of FIG. 6 was generated, it would be desirable to apply the charge balancing bias arrangement of FIG. 3D in intervals in which about 1000 program and erase cycles occur, maintaining the threshold voltage achieved by the erase bias arrangement of the memory cells below the target threshold set by the erase verify potential (line 670).

Figure 7:
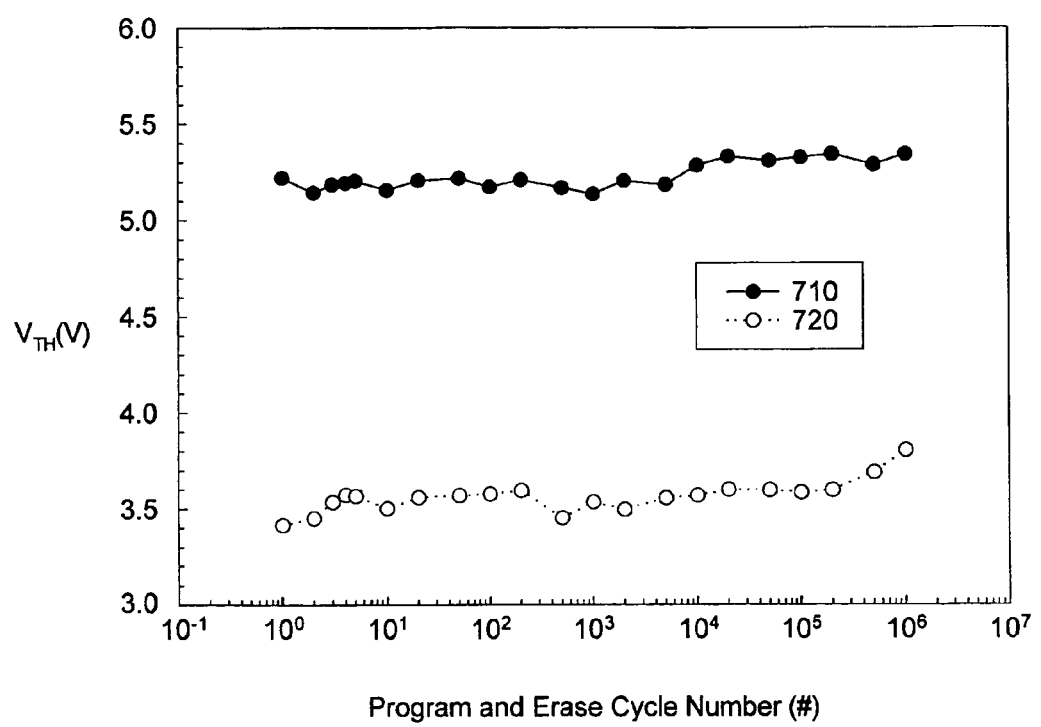
FIG. 7 is a graph of threshold voltage versus the number of program and erase cycles, and shows the consistency of threshold voltage of memory cells following a change of the distribution of charge.

FIG. 7 is a graph of threshold voltage versus the number of program and erase cycles, and shows the consistency of threshold voltage of memory cells maintained by applying the charge balancing bias arrangement, with a relatively long pulse of high negative voltage on the gate on the order of 0.5 seconds, after every 1000 program and erase cycles using CHE and BTBTHH. Data points 710 (solid dots) represent the threshold voltage of memory cells following a program operation. Data points 720 (hollow dots) represent the threshold voltage of memory cells following an erase operation. As can be seen, the threshold after the erase procedure remains below the target threshold of about 3.7 Volts for as many as 1 million program and erase cycles in this example.

Figure 8:
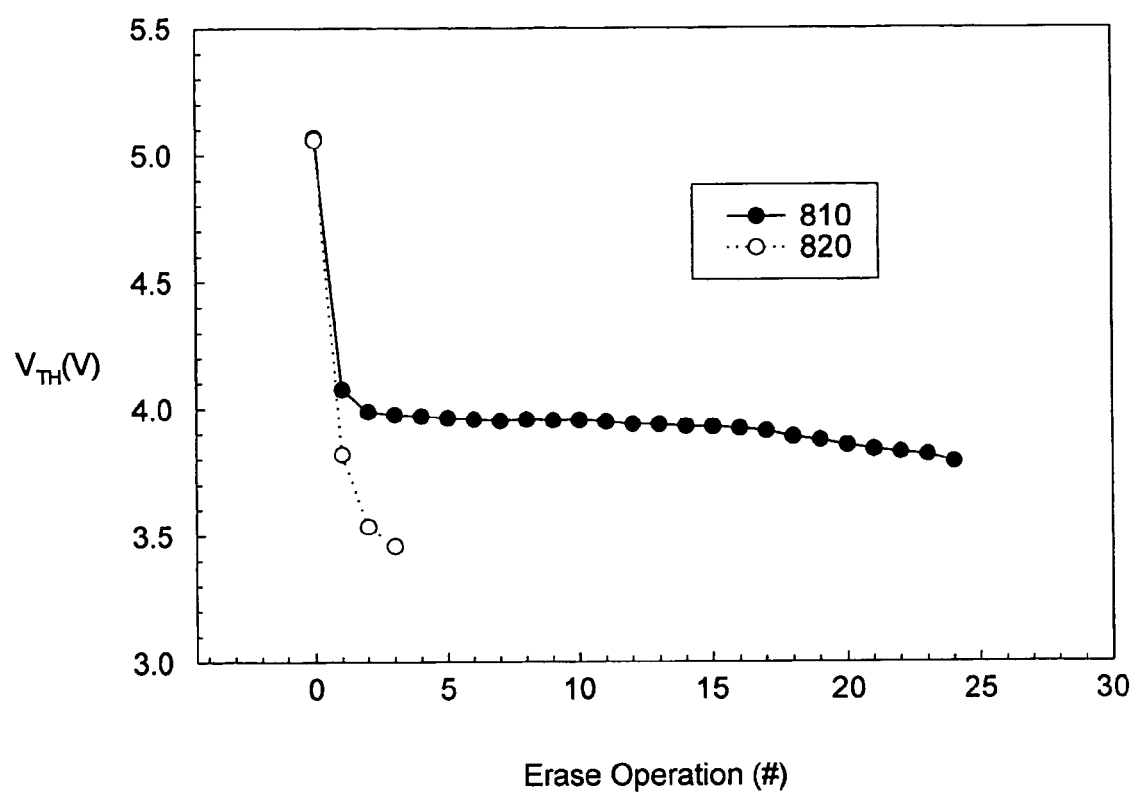
FIG. 8 is a graph of threshold voltage versus the number of erase operations, and compares the efficacy of the erase operation in lowering the threshold voltage with and without a change in the distribution of charge.

FIG. 8 is a graph of threshold voltage versus the number of erase pulses, and compares the efficacy of the erase operation in lowering the threshold voltage with and without a change in the distribution of charge. Data points 810 (solid dots) represent the memory cell prior to the negative charge balancing operation to change the distribution of charge. Prior to the negative charge balancing operation, the threshold voltage of the memory cell cannot be lowered sufficiently with the erase pulses alone, even after the erase pulse is applied many times. Data points 820 (hollow dots) represent the same memory cell after a negative charge balancing operation. The graph shows that the negative charge balancing operation quickly substantially eliminates the interference with the minimum threshold voltage achievable caused by program and erase cycling.

Figure 9:
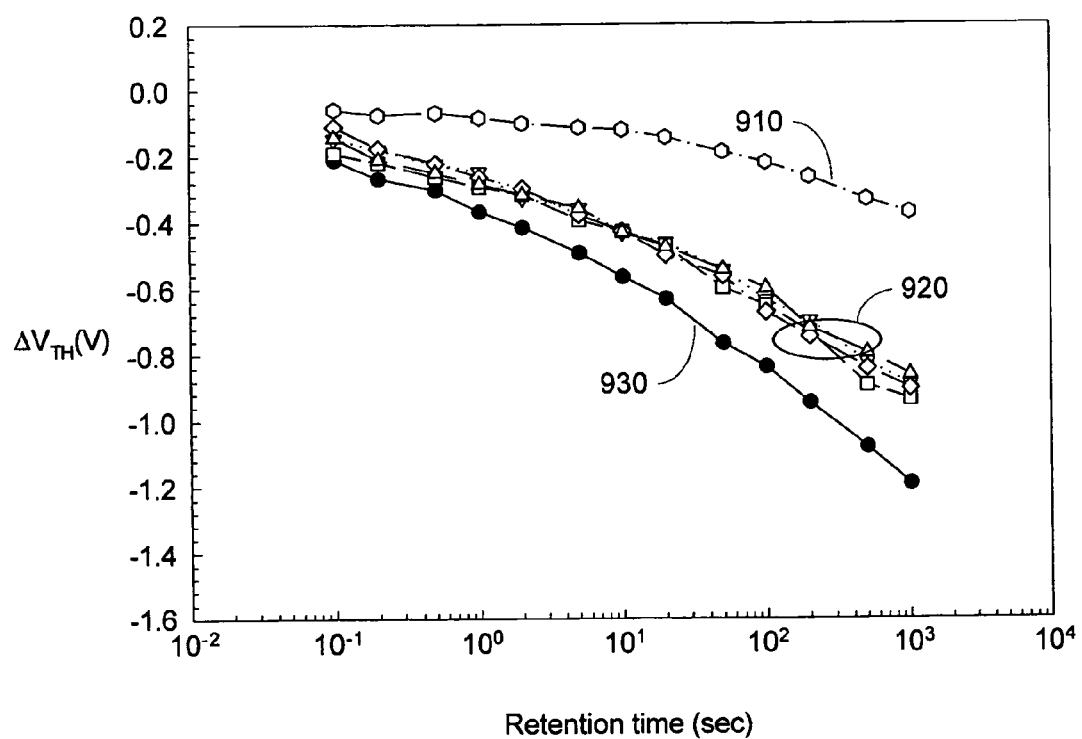
FIG. 9 is a graph of delta threshold voltage versus retention time, and compares a programmed memory cell without any program and erase cycles with memory cells undergoing many program and erase cycles.

FIG. 9 is a graph of the change in threshold voltage versus retention time, and compares a programmed memory cell without any program and erase cycles with memory cells undergoing many program and erase cycles. Trace 910 represents a programmed memory cell that has not undergone any program and erase cycles, so that charge retention is good. The data sets 920 and 930 both represent a memory cell that has undergone 150,000 program and erase cycles, with a negative charge balancing operation every 900 program and erase cycles. The data set 920 represents a cycled memory cell that undergoes the data retention test immediately after the negative charge balancing operation. In contrast, the data set 930 represents a cycled memory cell that has a data retention test before undergoing the negative charge balancing operation. To accelerate the retention test, a potential of −10 V is applied to the gate, thereby accelerating the detrapping of trapped electrons from the charge trapping structure of the memory cell. Because a larger change in threshold represents worse data retention, the graph shows that the negative charge balancing operation improves data retention of the memory cell.

Figure 10:
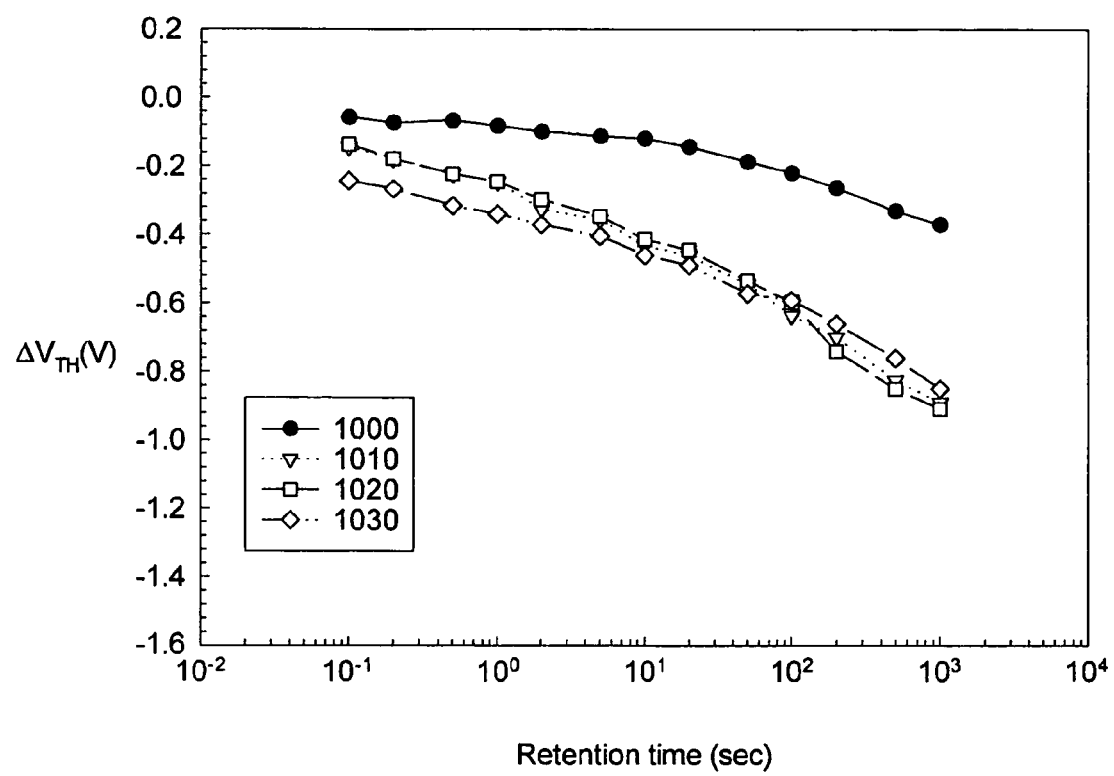
FIG. 10 is a graph of delta threshold voltage versus retention time, and compares memory cells that have charge added prior to any program and erase cycles but afterwards experience a different number of program and erase cycles.

FIG. 10 is a graph of change in threshold voltage versus retention time, and compares memory cells that have the negative charge balancing operation applied prior to any program and erase cycles but afterwards experience a different number of program and erase cycles. Data points 1000 (solid dot) represent a programmed memory cell that has not undergone any program and erase cycles. The data sets 1010 (hollow triangle), 1020 (hollow square), and 1030 (hollow diamond) respectively represent memory cells that have 150,000 program and erase cycles, 200,000 program and erase cycles, and 1,000,000 program and erase cycles. The memory cells represented by data sets 1010, 1020, and 1030 undergo an operation to change the distribution of charge every 1000 program and erase cycles. The data retention test occurs immediately after an operation to change the distribution of charge. As can be seen, the periodic application of the negative charge balancing operation results in substantially constant data retention characteristics for cells that have undergone 150,000 program and erase cycles, 200,000 program and erase cycles, and 1,000,000 program and erase cycles, respectively.

Figure 11:
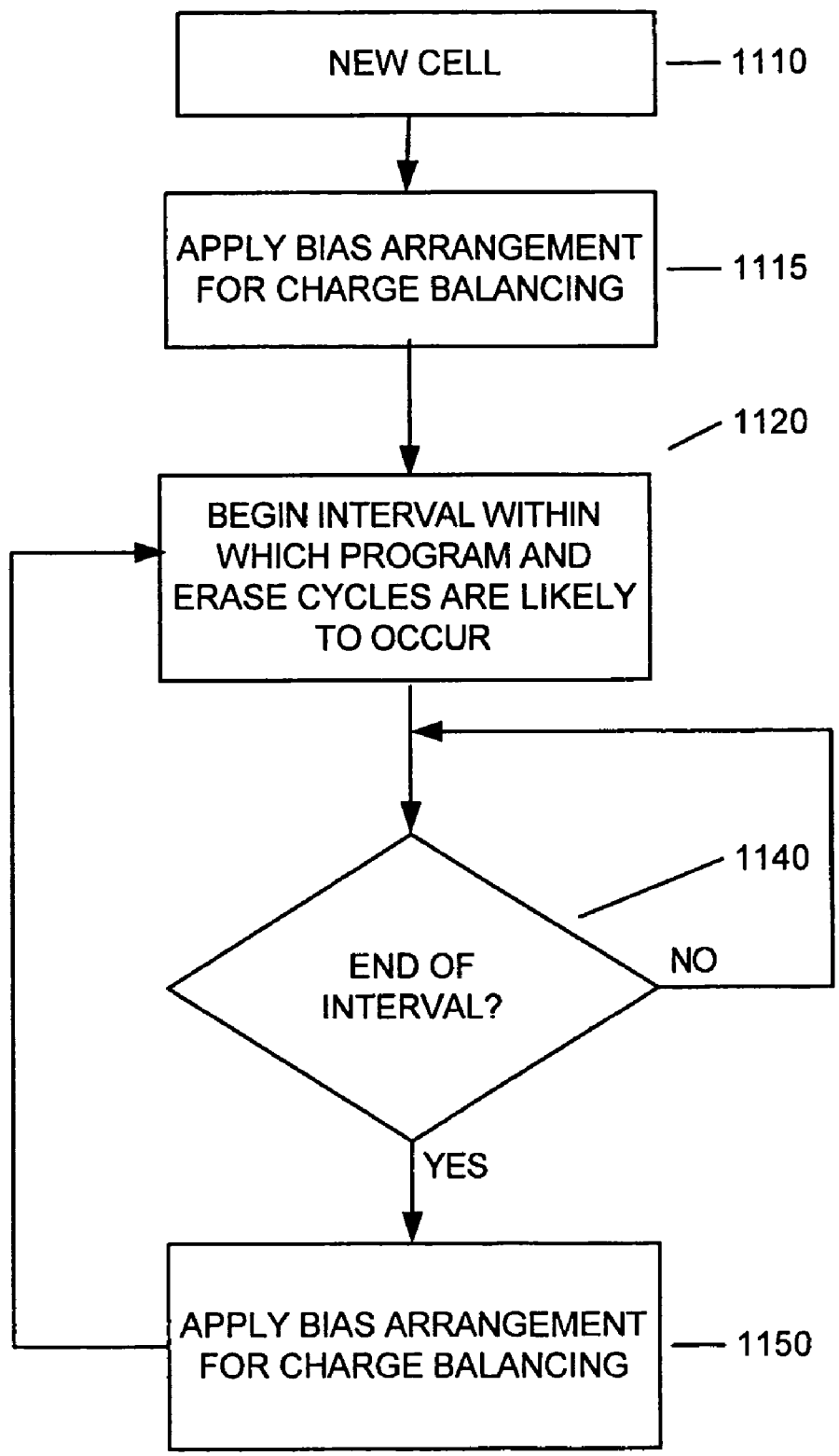
FIG. 11 illustrates a representative process for adding charge to a charge trapping memory cell prior to any program and erase cycles, and changing a distribution of charge in the charge trapping memory cell following an interval in which program and erase cycles are likely to occur.

FIG. 11 illustrates a representative process for adding charge to a charge trapping memory cell prior to any program and erase cycles, and changing a distribution of charge in the charge trapping memory cell following an interval in which program and erase cycles are likely to occur. A new memory cell 1110 has not experienced any program and erase cycles yet. At 1115, charge is added to the cell by applying a charge balancing pulse. At 1120, an interval begins within which program and erase cycles are likely to occur. Programming and erasing occur via first and second bias arrangements. At 1140, a determination occurs as to whether the interval is over. If not, the interval continues. Otherwise, at 1150 the distribution of charge in the memory cell is changed via a third bias arrangement. The third bias arrangement comprises a pulse with negative gate voltage relative to the substrate in the region of the channel, tending to balance the charge distribution, by electron injection current from the gate to the charge trapping structure, and ejection current which occurs between the charge trapping structure and the channel, substantially across the length of the channel. In some embodiments, the pulse applied has a pulse length sufficient to substantially converge the threshold voltage of the memory cells in the array on a target convergence threshold, such as 0.5 to 1.0 seconds for a pulse height of about −20 Volts in this example. In various embodiments, the interval ends after a random number of program and erase cycles, and/or when the memory cell fails to erase. In another embodiment, the interval includes the time between power up events, such as a time from supplying power to a machine including the memory cell until powering off the machine and powering it on again. In this way, the third bias arrangement is applied after turning on the machine.

Figure 12:
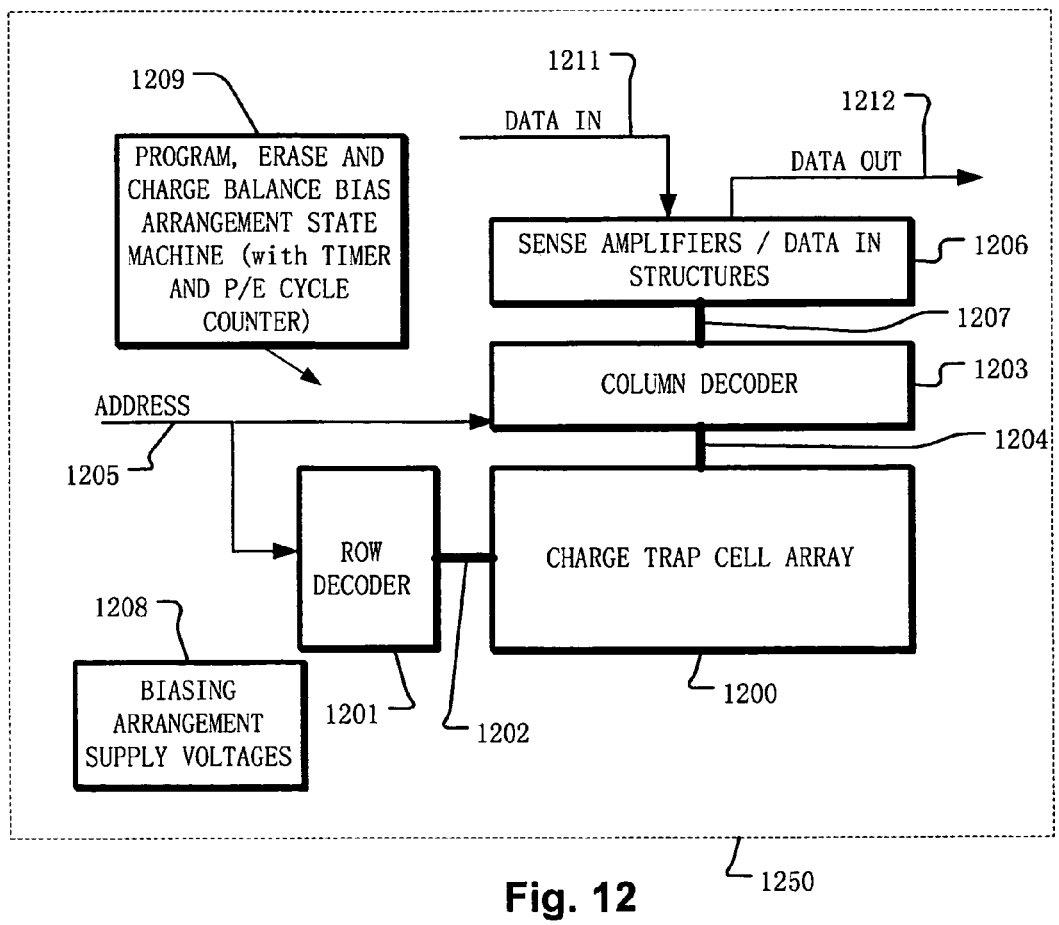
FIG. 12 is a simplified block diagram of an integrated circuit according to an embodiment of the present invention.

FIG. 12 is a simplified block diagram of an integrated circuit according to an embodiment of the present invention. The integrated circuit 1250 includes a memory array 1200 implemented using localized charge trapping memory cells, on a semiconductor substrate. A row decoder 1201 is coupled to a plurality of wordlines 1202 arranged along rows in the memory array 1200. A column decoder 1203 is coupled to a plurality of bitlines 1204 arranged along columns in the memory array 1200. Addresses are supplied on bus 1205 to column decoder 1203 and row decoder 1201. Sense amplifiers and data-in structures in block 1206 are coupled to the column decoder 1203 via data bus 1207. Data is supplied via the data-in line 1211 from input/output ports on the integrated circuit 1250, or from other data sources internal or external to the integrated circuit 1250, to the data-in structures in block 1206. Data is supplied via the data-out line 1212 from the sense amplifiers in block 1206 to input/output ports on the integrated circuit 1250, or to other data destinations internal or external to the integrated circuit 1250. A bias arrangement state machine 1209 controls the application of bias arrangement supply voltages 1208, such as for the erase verify and program verify voltages, the first and second bias arrangements for programming and lowering the threshold voltage of the memory cells, and the third bias arrangement to change a distribution of charge in the charge trapping structure of a memory cell.

Figure 13:
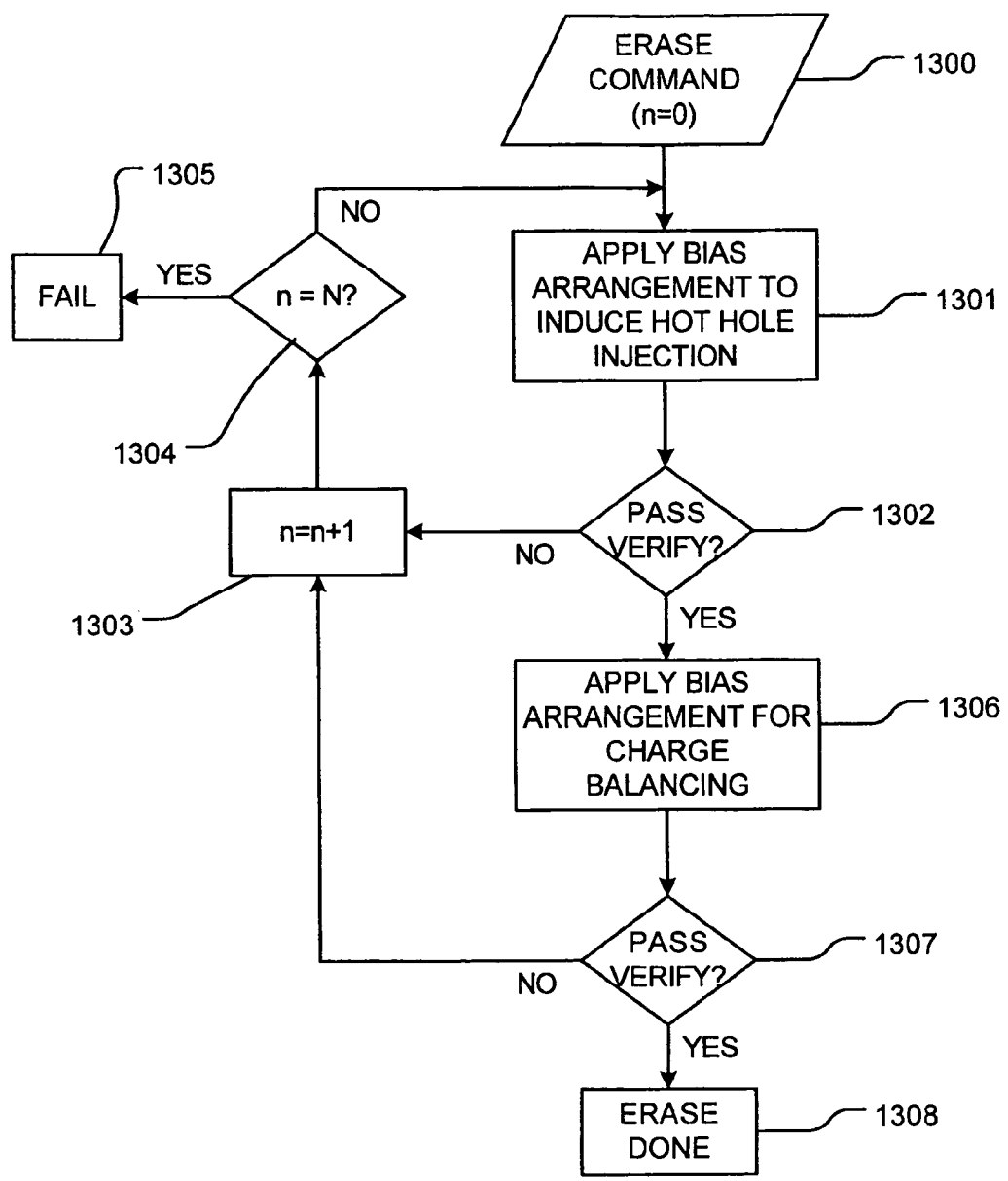
FIG. 13 is a flow chart for an erase process including a balancing pulse.
Figure 14:
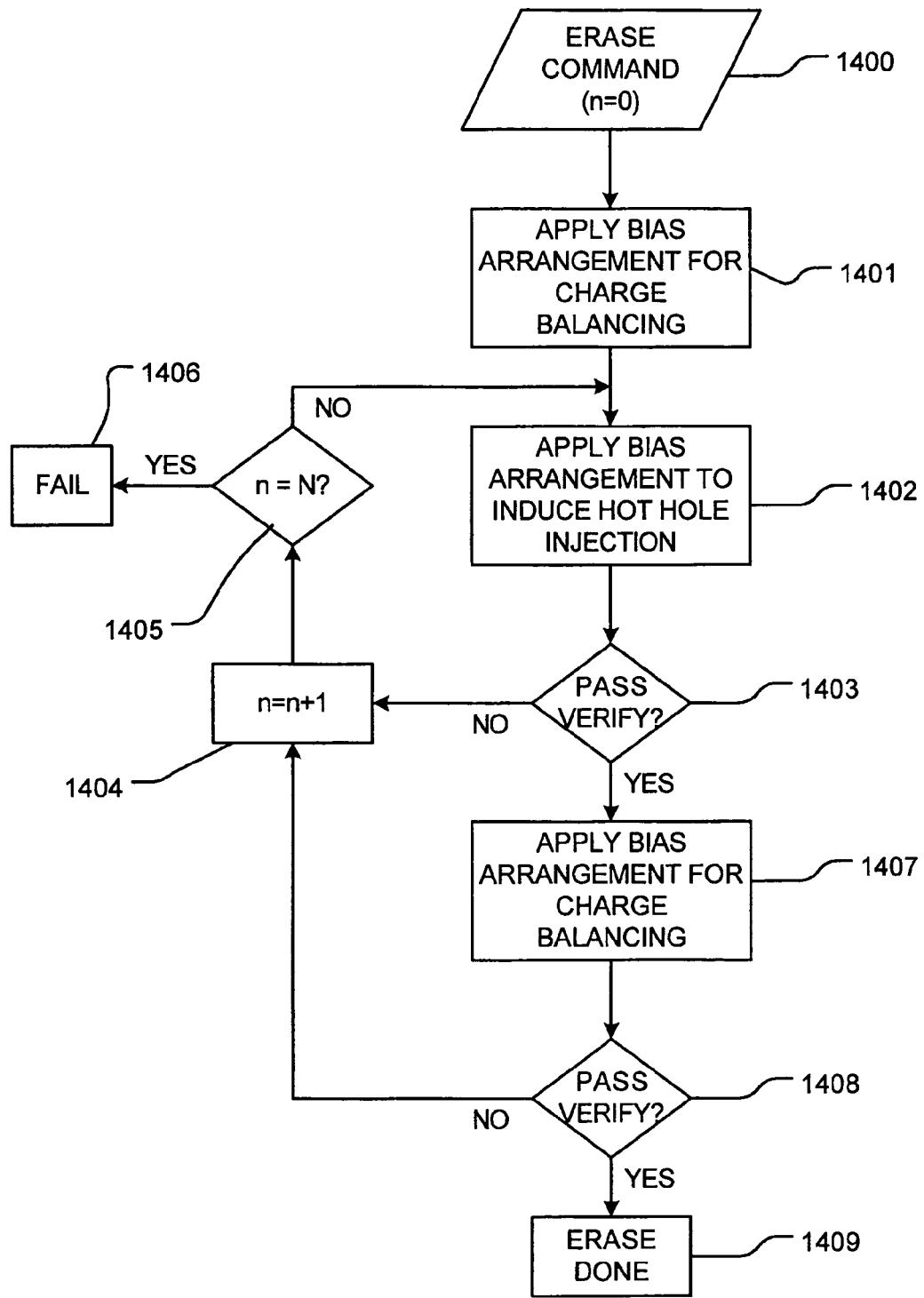
FIG. 14 is a flow chart of an alternative erase process including a balancing pulse.

The technology is applied in combination with an erase procedure, or other procedure adapted to establish a low threshold state in the memory cell, as illustrated in FIG. 13 and FIG. 14. In FIG. 13, an erase procedure is initiated by an erase command (block 1300). Heuristically at this point, an index n is set to zero for use in the erase procedure. The erase command in some implementations corresponds with a "flash" sector erase operation typical for flash memory devices in the art. In response to the erase command, a biasing procedure is instituted. In one embodiment, the first operation in the biasing procedure is to apply a bias arrangement that induces hot hole injection in the sector of memory cells (block 1301). For example, wordlines in the sector are biased with about −3 to −7 volts, bit lines coupled to the drains of the memory cells are biased with about +3 to +7 volts, and the source lines coupled to the sources of the memory cells in the sector are biased with ground, while the substrate region in which the memory cell channels are formed is grounded. This induces hot hole injection on the side of the charge trapping structure adjacent the drain terminal for the memory cells in the sector being erased. After applying the hot hole injection bias arrangement, a state machine or other logic determines whether the erase operation has been successful for each cell in the sector by performing an erase verify operation. Thus, in the next step, the algorithm determines whether the memory cells passed the verify operation (block 1302). If the cell does not pass verify, then the index n is incremented (block 1303), and the algorithm determines whether the index has reached a pre-specified maximum number N of retries (block 1304). If the maximum number of retries has been executed without passing verify, then the procedure fails (block 1305). If the maximum number of retries has not been executed at block 1304, then the procedure returns to block 1302 to retry the hot hole injection bias arrangement. If at block 1302, the memory cell passes verify, then a charge balancing bias operation, which simultaneously causes electron injection and electron ejection current as described above with reference to FIG. 1B, is applied (block 1306). The charge balancing biasing operation includes a negative gate voltage pulse having a length on the order of 10 to 100 milliseconds, and for example about 50 milliseconds. Such a pulse tends to balance the charge distribution in the memory cell and neutralize trapped holes, and is sufficient to improve the endurance and reliability the memory cell, as described above. After the charge balancing biasing operation, an erase verify operation is repeated (block 1307). If the memory cell does not pass verify, then the algorithm loops to block 1303, increments the index n and retries or fails depending on whether the maximum number of retries has been attempted. If at block 1307, the algorithm passes, then the erase procedure is finished (block 1308).

In FIG. 14, an erase procedure is initiated by an erase command (block 1400). Heuristically at this point, an index n is set to zero for use in the erase procedure. The erase command in some implementations corresponds with a "flash" sector erase operation typical for flash memory devices in the art. In response to the erase command, a biasing procedure is instituted. In this example, after the erase command, a charge balancing bias arrangement is applied which induces electron injection and electron ejection current as described above (block 1401). The charge balancing biasing operation includes a negative gate voltage pulse having a length on the order of 10 to 100 milliseconds, and for example about 50 milliseconds. This charge balancing bias arrangement tends to cause convergence of the amount of charge stored in the memory cells in the sector on the target threshold while balancing the distribution of charge. In other embodiments, the charge balancing bias arrangement includes a negative gate voltage pulse having a length on the order of 500 to 1000 milliseconds, in order to achieve, or nearly achieve, the equilibrium state in trapped charge during each erase cycle. The pulse length for the negative gate voltage pulse is chosen according to the embodiment of the memory array, the timing budget allowed for the sector erase procedure, the length of the hot hole injection bias arrangement applied and other factors. The next operation in the biasing procedure is to apply a bias arrangement that induces hot hole injection in the sector of memory cells (block 1402). For example, wordlines in the sector are biased with about −3 to −7 volts, bit lines coupled to the drains of the memory cells are biased with about +3 to +7 volts, and the source lines coupled to the sources of the memory cells in the sector are biased with ground, while the substrate region in which the memory cell channels are formed is grounded. This induces hot hole injection on the side of the charge trapping structure adjacent the drain terminal for the memory cells in the sector being erased. Because of the previous charge balancing bias arrangement of block 1401, a more uniform result is achieved by the hot hole injection bias arrangement. After applying the hot hole injection bias arrangement, a state machine or other logic determines whether the erase operation has been successful for each cell in the sector by performing an erase verify operation. Thus, in the next step, the algorithm determines whether the memory cells passed the verify operation (block 1403). If the cell does not pass verify, then the index n is incremented (block 1404), and the algorithm determines whether the index has reached a pre-specified maximum number N of retries (block 1405). If the maximum number of retries has been executed without passing verify, then the procedure fails (block 1406). If the maximum number of retries has not been executed at block 1405, then the procedure returns to block 1402 to retry the hot hole injection bias arrangement. If at block 1403, the memory cell passes verify, then a second charge balancing bias arrangement, which simultaneously causes electron injection and electron ejection current as described above is applied (block 1407). The charge balancing biasing operation includes a negative gate voltage pulse having a length on the order of 10 to 100 milliseconds, and for example about 50 milliseconds. Such a pulse tends to balance the charge distribution in the memory cell and neutralize trapped holes, and is sufficient to improve the endurance and reliability of the memory cell, as described above. In some embodiments of the technology, the second charge balancing arrangement of block 1407 is not utilized. The pulse lengths in the charge balancing biasing operation of block 1401 and the charge balancing biasing operation of 1407 might be shorter than in embodiments where only one charge balancing biasing operation is applied. After the charge balancing biasing operation at block 1407, an erase verify operation is repeated (block 1408). If the memory cell does not pass verify, then the algorithm loops to block 1404, increments the index n and retries or fails depending on whether the maximum number of retries has been attempted. If at block 1408, the algorithm passes, then the erase procedure is finished (block 1409).

Figure 15:
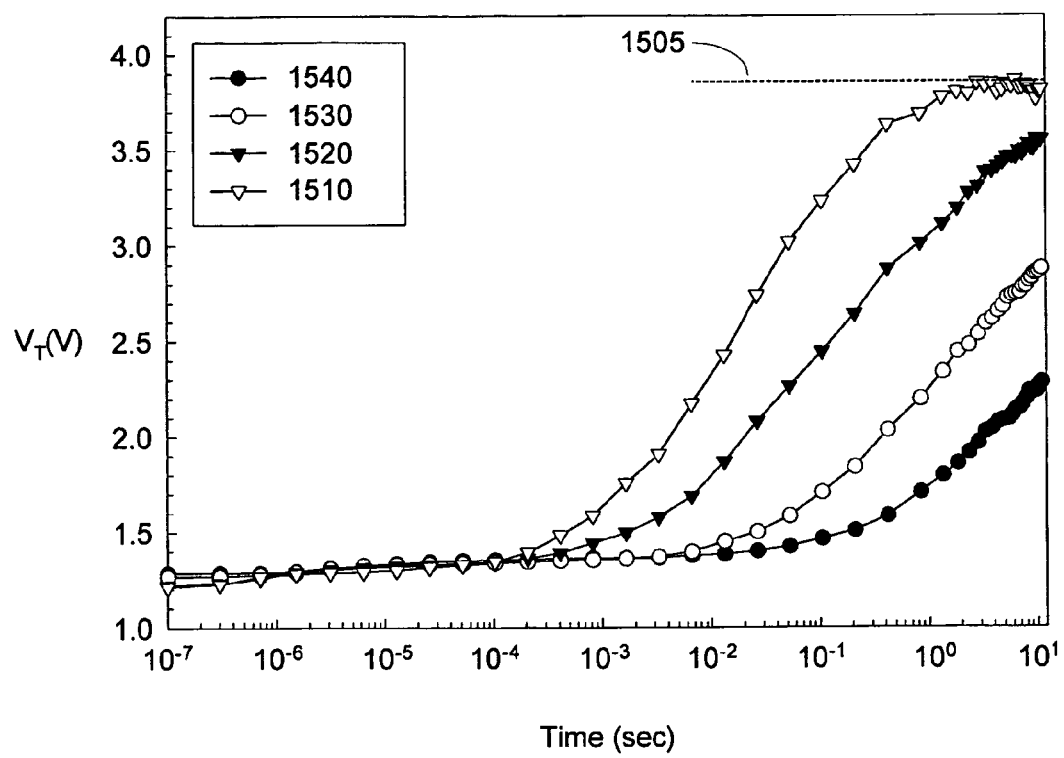
FIG. 15 is a graph of threshold voltage versus time, and compares the different rates of saturation at various gate voltages.

FIG. 15 is a graph of threshold voltage versus time, where the time is the length of time that a negative-gate charge balancing bias pulse is applied to a low threshold cell, such as a fresh cell prior to program and erase cycling as illustrated for example in FIGS. 1A and 1B. The four traces including data points 1510 (hollow triangle), 1520 (solid triangle), 1530 (hollow dot) and 1540 (solid dot), compare the different rates of threshold convergence at various gate voltages. The memory cells for this experiment have L/W dimensions of=0.5 μm/0.38 μm, ONO (oxide-nitride-oxide) stack dimensions of 55 Å/60 Å/90 Å, and a p+ poly gate. Prior to any program and erase cycles, a negative-gate charge balancing pulse including a negative voltage on the gate while grounding the source, substrate, and drain, is applied. The data points 1510 correspond to applying −21 V to the gate; data points 1520 correspond to applying −20 V to the gate; data points 1530 correspond to applying −19 V to the gate; and data points 1540 correspond to applying −18 V to the gate. The threshold voltages of data points 1510, 1520, 1530, and 1540 all saturate towards a common convergence voltage 1505 of about 3.8 V. A higher magnitude of the negative gate voltage causes a faster saturation of the threshold voltage. With about −21 V on the gate, the threshold convergence is substantially completed with a pulse of about 0.1 to 1.0 seconds. Other embodiments apply a higher magnitude gate voltage to decrease time required to saturate the threshold voltage to the convergence voltage, or apply a lower magnitude gate voltage to increase the time required to saturate the threshold voltage to the convergence voltage. Thicker dimensions of the ONO stack or a thicker bottom oxide would increase the time required to saturate the threshold voltage to the convergence voltage, or require a higher magnitude of the negative gate voltage to saturate the threshold voltage in the same amount of time. Similarly, thinner dimensions of the ONO stack or a thinner bottom oxide would decrease the time required to saturate the threshold voltage to the convergence voltage, or require a lower magnitude of the negative gate voltage to saturate the threshold voltage in the same amount of time.

Figure 16:
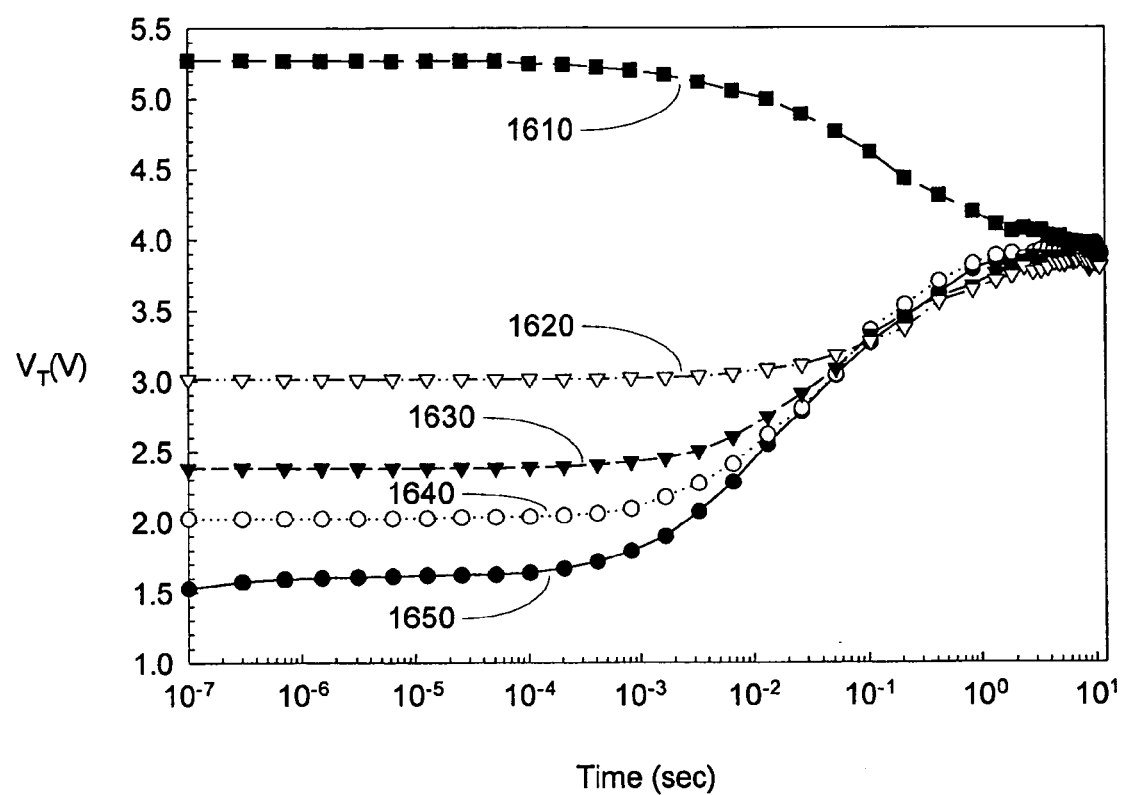
FIGS. 16 and 17 are graphs of threshold voltage versus time, and show the convergent behavior of the memory cell in response to a bias that changes a distribution of charge in the charge trapping structure.
Figure 17:
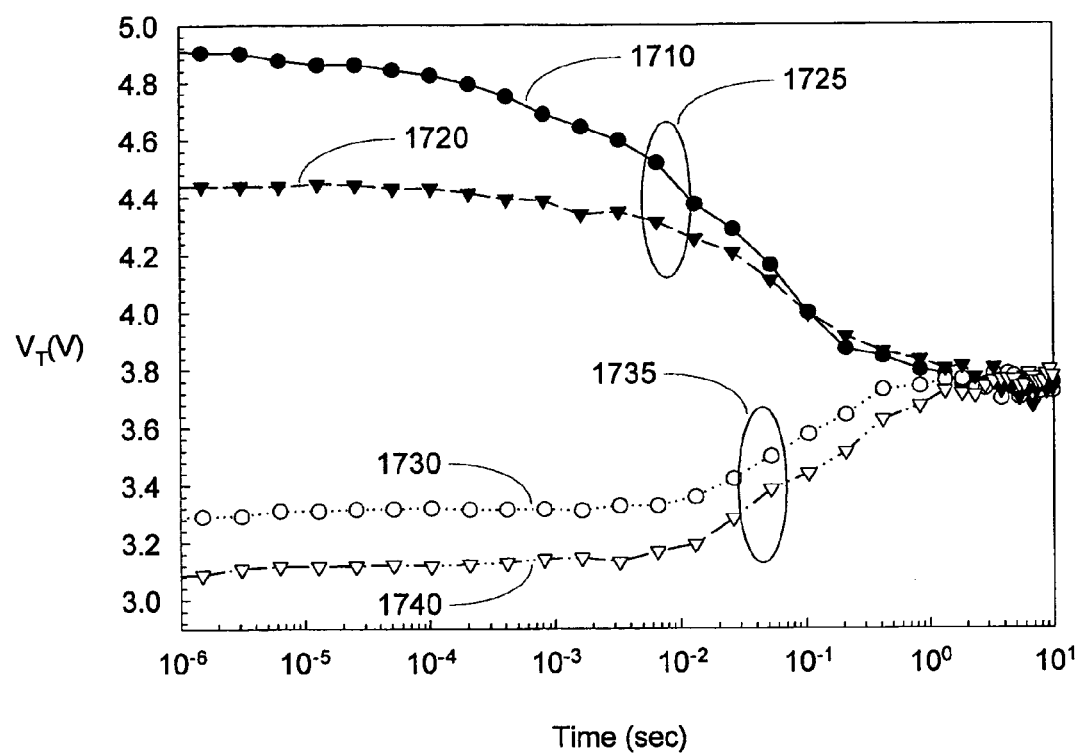

FIGS. 16 and 17 are graphs of threshold voltage versus time, and show the convergent behavior of the memory cell in response to a bias that changes a distribution of charge in the charge trapping structure. The memory cells have L/W dimensions of=0.5 μm/0.38 μm.

With regard to FIG. 16, the threshold voltages of memory cells that have not undergone any program and erase cycles are raised to varying degrees as indicated by starting threshold levels of the five traces 1610, 1620, 1630, 1640, and 1650, by adding different amounts of electrons via Fowler-Nordheim tunneling to the charge trapping layers. After adding these electrons, the memory cell of trace 1610 has a threshold voltage of about 5.3 V, the memory cell of trace 1620 has a threshold voltage of about 3.0 V, the memory cell of trace 1630 has a threshold voltage of about 2.4 V, the memory cell of trace 1640 has a threshold voltage of about 2.0 V, and the memory cell of trace 1650 has a threshold voltage of about 1.5 V. The graph illustrates the variation of the threshold voltages of these memory cells versus time as a negative voltage of −21 V is applied to the gate while grounding the source, substrate, and drain. The memory cells corresponding to traces 1610, 1620, 1630, 1640, and 1650 all converge towards a common convergence voltage of about 3.9 V after about 1 second of negative gate biasing to induce the charge balancing operation.

With regard to FIG. 17, the threshold voltages of the memory cells of the four traces 1710, 1720, 1730 and 1740 are established by hot carrier charging including via channel hot electron injection and hot hole injection. The threshold voltage of the memory cell of trace 1710 is raised to about 4.9 V. The threshold voltage of the memory cell of trace 1720 is raised to about 4.4 V. The threshold voltage of the memory cell of trace 1730 is about 3.3 V. The threshold voltage of the memory cell of trace 1740 is about 3.1 V. The graph illustrates the variation of the threshold voltages of the memory cells of traces 1710, 1720, 1730, and 1740 versus time as a negative voltage of −21 V is applied to the gate while grounding the source, substrate, and drain. The memory cells corresponding to traces 1710, 1720, 1730, and 1740 all converge towards a common convergence voltage of about 3.7 V after about 1 second of negative gate FN biasing to induce the charge balancing operation.

FIGS. 16 and 17 illustrate that, despite the different types of charge movement involved that changed the threshold voltages of the memory cells to different values, application of the bias that is sufficient to induce electron injection current and electron ejection current, and that balances the distribution of charge, returns the threshold voltage of the memory cells to their convergence voltages, while reducing trapped holes and electrons that would otherwise make the cell hard to erase and unreliable. Other embodiments apply a higher magnitude gate voltage to decrease time required to saturate the threshold voltage to the convergence voltage, or apply a lower magnitude gate voltage to increase the time required to saturate the threshold voltage to the convergence voltage.

Figure 18:
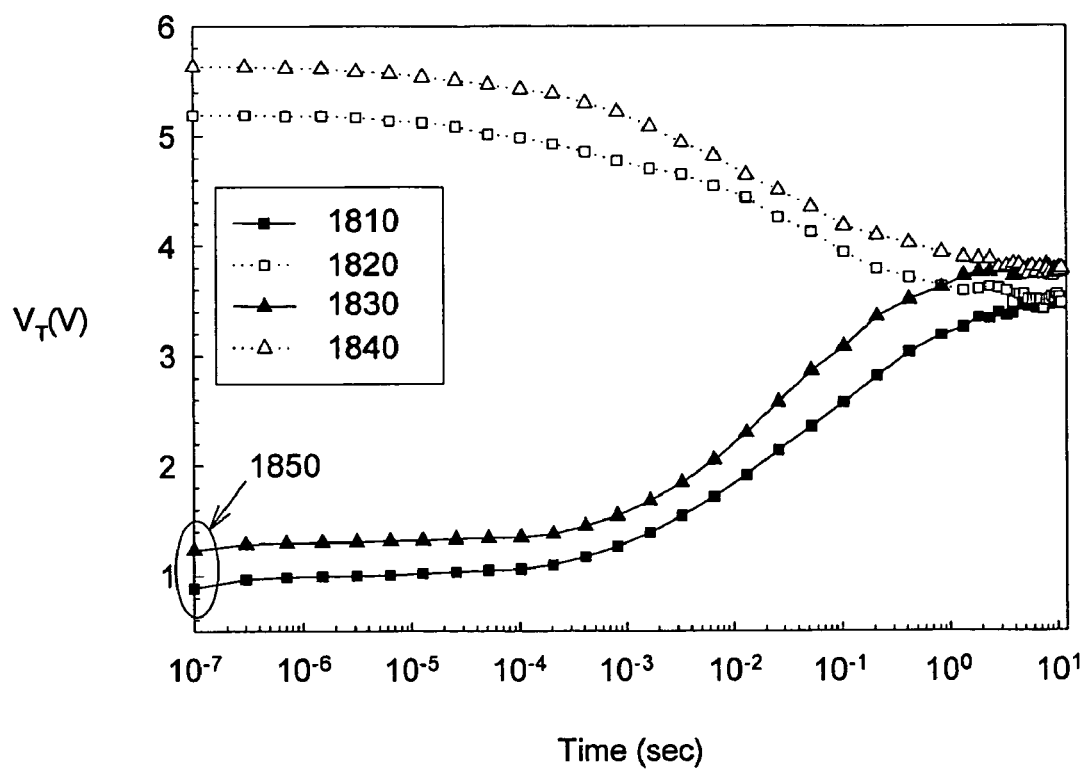
FIG. 18 is a graph of threshold voltage versus time, and shows the convergent behavior for memory cells with different channel lengths.

FIG. 18 is a graph of threshold voltage versus time, and shows the convergent behavior for memory cells with different channel lengths. The memory cells corresponding to traces 1810 and 1820 have a channel length of 0.38 μm, and the memory cells corresponding to traces 1830 and 1840 have a channel length of 0.50 μm. The threshold voltages of the memory cells of traces 1820 and 1840 are raised via channel hot electrons added to the charge trapping structure. The threshold voltage of the memory cell of trace 1820 is raised to about 5.2 V. The threshold voltage of the memory cell of trace 1840 is raised to about 5.6 V. The memory cells corresponding to traces 1810 and 1830 have not undergone any program and erase cycles. The graph illustrates the variation of the threshold voltages of the memory cells of traces 1810, 1820, 1830, and 1840 versus time as a negative voltage of −21 V is applied to the gate while grounding the source, substrate, and drain. The memory cells corresponding to traces 1830 and 1840 saturate towards a common convergence voltage of about 3.8 V. The memory cells corresponding to traces 1810 and 1820 saturate towards a common convergence voltage of about 3.5 V. FIG. 18 illustrates that memory cells with the same channel length saturate towards a common convergence voltage in response to the application of the bias that changes the distribution of charge. FIG. 18 illustrates that memory cells with different channel lengths saturate towards different convergence voltages in response to the application of the bias that changes the distribution of charge. However the difference in channel length is not a primary contributor to the convergence voltage, so that variations in channel length across an array have negligible effect on the target threshold voltage distribution in the array.

The threshold voltage roll-off effect, illustrated for example at 1850, is responsible for memory cells with shorter channel lengths having lower threshold voltages and lower convergence voltages. Thus, scaling a memory cell's channel length to smaller dimensions will lower the threshold voltage and convergence voltage of the memory cell in response to the application of the bias that changes the distribution of charge. Similarly, scaling a memory cell's channel length to higher dimensions will raise the threshold voltage and convergence voltage of the memory cell in response to the application of the bias that changes the distribution of charge. Other embodiments apply a higher magnitude gate voltage to decrease time required to saturate the threshold voltage to the convergence voltage, or apply a lower magnitude gate voltage to increase the time required to saturate the threshold voltage to the convergence voltage. Also, changes in the target convergence threshold can be made by selecting gate materials with different work function, where higher work function materials tend to lower the convergence threshold. Also, changes in the convergence threshold can be made by selecting the top oxide and bottom oxide materials to favor tunneling in one of the top and bottom oxides, where favoring tunneling in the top oxide tends to reduce the convergence threshold, and visa versa.

Figure 19:
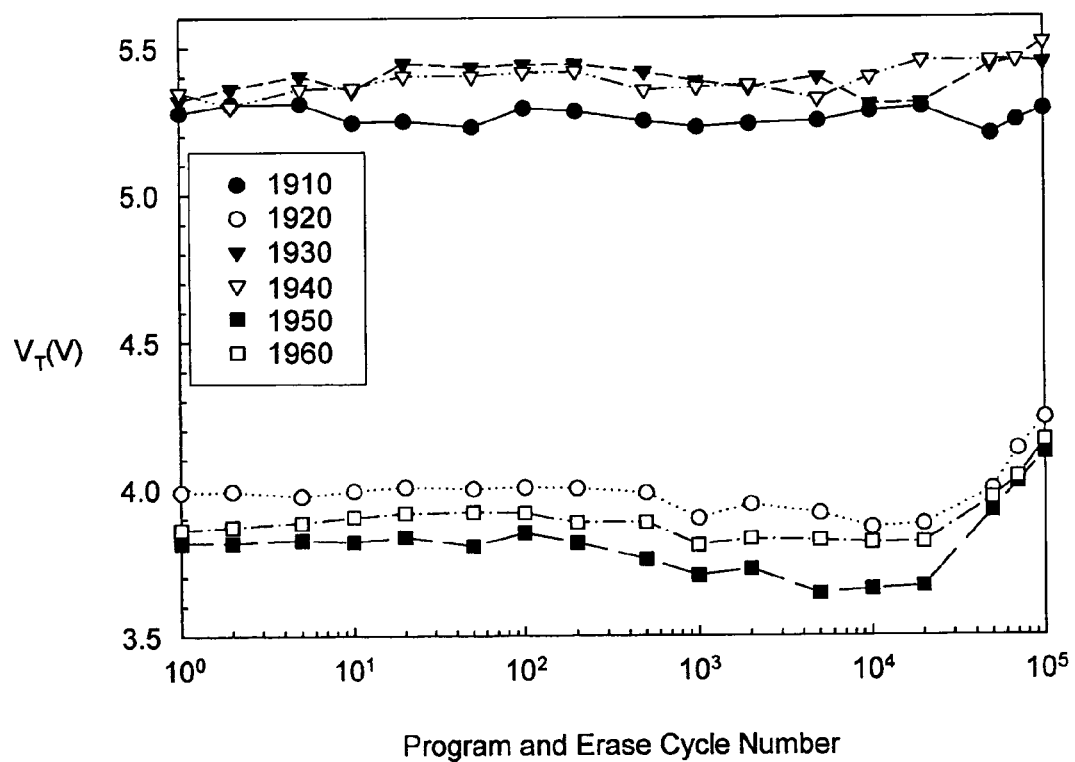
FIG. 19 is a graph of threshold voltage versus the number of program and erase cycles for a multi-bit memory cell with regular changes in the distribution of charge.
Figure 20:
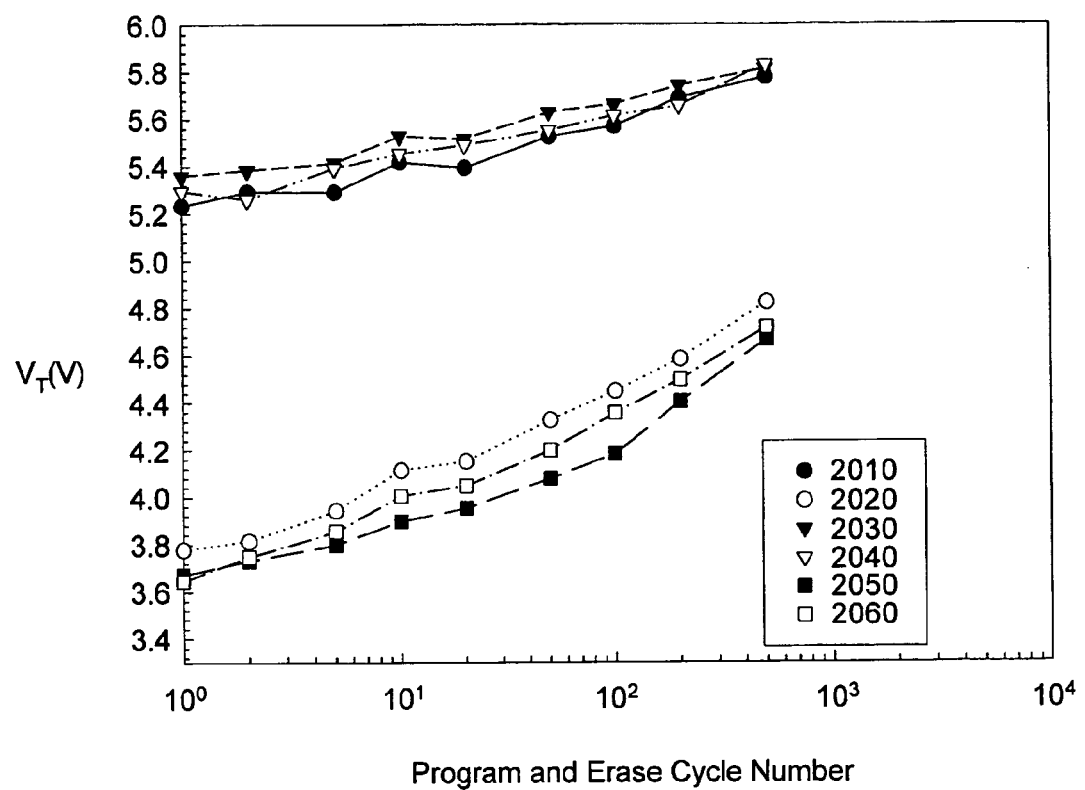
FIG. 20 is a graph of threshold voltage versus the number of program and erase cycles for a multi-bit memory cell without regular changes in the distribution of charge.

FIGS. 19 and 20 together show the effectiveness of a bias that balances distribution of charge in maintaining threshold voltages that are achievable in a memory cell.

FIG. 19 is a graph of threshold voltage versus the number of program and erase cycles for a multi-bit memory cell with regular changes in the distribution of charge. The first bit is programmed, and in trace 1910 (solid dots) the first bit is read and in trace 1920 (hollow dots) the second bit is read. The second bit is programmed, and in trace 1930 (solid triangles) the first bit is read and in trace 1940 (hollow triangles) the second bit is read. In trace 1950 (solid squares), the first bit is erased and read. In trace 1960 (hollow squares), the second bit is erased and read. When a bit is programmed, for 1 microsecond the gate voltage is 11.5 V, one of the drain voltage/source voltage is 5 V, the other of the drain voltage/source voltage is 0 V, and the substrate is −2.5 V. While programming, CHannel Initiated Secondary Electron (CHISEL) movement occurs into the charge trapping structure. When a bit is erased, for 1 millisecond the gate voltage is −1.8 V, one of the drain voltage/source voltage is 6 V, the other of the drain voltage/source voltage is 0 V, and the substrate is 0 V. While erasing, movement of hot holes occurs into the charge trapping structure. During the erase cycle, a negative gate bias that tends to balance the charge in the charge trapping layer is applied to the memory for a 50 milliseconds pulse with a gate voltage of −21 V and grounded source, drain, and substrate. As can be seen, the threshold voltages are maintained within a good distribution for about 100,000 P/E cycles.

FIG. 20 is a graph of threshold voltage versus the number of program and erase cycles for a multi-bit memory cell, similar to FIG. 19. However, unlike FIG. 19, a negative gate FN bias that changes the distribution of charge is not applied to the memory cell during the erase cycle. As a result, interference from charge in the charge trapping structure increases over the number of program and erase cycles, increasing the threshold voltage over the number of program and erase cycles. The first bit is programmed, and in trace 2010 (solid dots) the first bit is read and in trace 2020 (hollow dots) the second bit is read. The second bit is programmed, and in trace 2030 (solid triangles) the first bit is read and in trace 2040 (hollow triangles) the second bit is read. In trace 2050 (solid squares), the first bit is erased and read. In trace 2060 (hollow squares), the second bit is erased and read. In less than 10 program and erase cycles, the threshold voltage following both erase and program operations is significantly raised, and after 500 program and erase cycles, the threshold voltage of the memory cell following an erase operation without the charge balancing operation described herein, is raised by more than 1 V.

FIGS. 19 and 20 together show that applying a bias that tends to balance the distribution of charge in the memory cell reduces or eliminates the interference with the threshold voltage achievable in the memory cell following both erase and program operations. Other embodiments apply a higher magnitude gate voltage to decrease time required to saturate the threshold voltage to the convergence voltage, or apply a lower magnitude gate voltage to increase the time required to saturate the threshold voltage to the convergence voltage. Other embodiments increase or decrease the duration of applying the negative gate voltage, to change the degree to which the threshold voltage approaches the convergence voltage.

Figure 21:
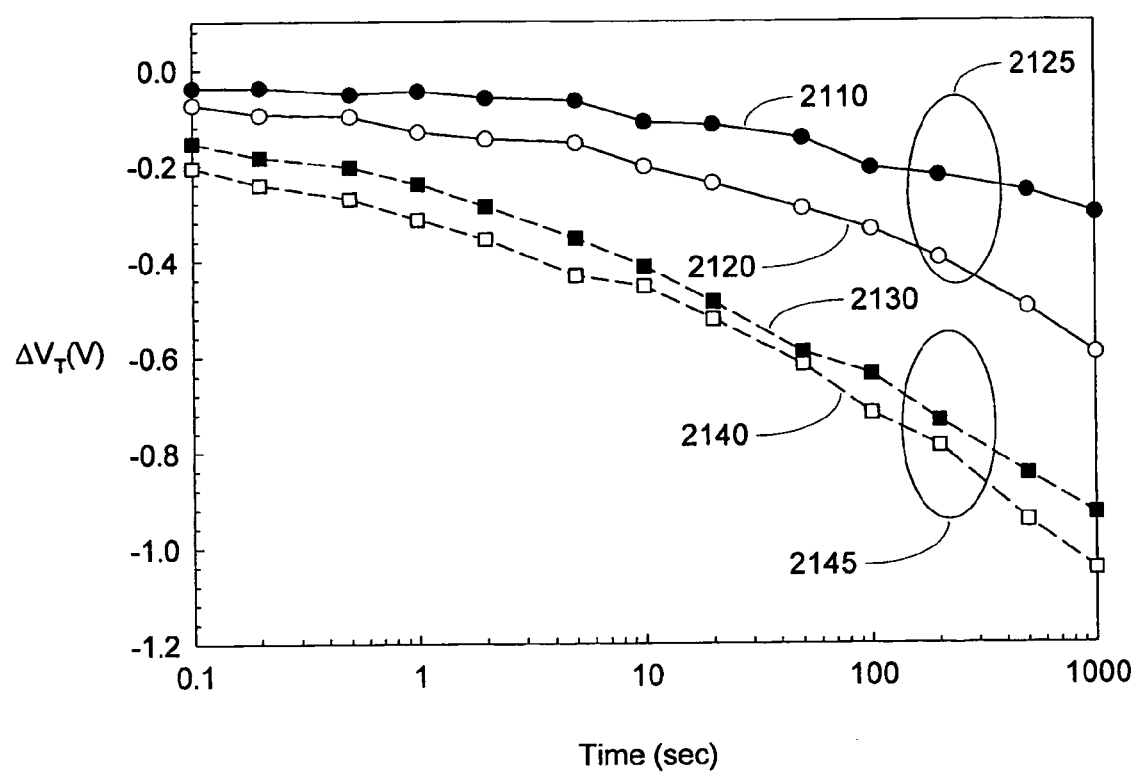
FIG. 21 is a graph of delta threshold voltage versus retention time, and contrasts memory cells with and without regular changes in the distribution of charge.

FIG. 21 is a graph of change in threshold voltage versus retention time, and contrasts memory cells with and without regular negative gate pulses applied that tend to balance the distribution of charge. The memory cell of traces 2110, 2120, 2130, and 2140 are all subjected to 10,000 program and erase cycles. However, during the erase cycles of the memory cells of traces 2110 and 2120, collectively referred to as traces 2125, a negative gate pulse is applied that changes the distribution of charge in the memory cell. For the memory cells of traces 2130 and 2140, collectively referred to as traces 2145, a negative gate pulse is not applied to the memory cell. Because a larger change in threshold represents worse data retention, the graph shows that the operation to balance the distribution of charge improves data retention of the memory cell. During the retention test, a negative gate voltage of −7 V is applied to the gate of the memory cells of traces 2110 and 2130, and a negative gate voltage of −9 V is applied to the gate of the memory cells of traces 2120 and 2140. Due to increased voltage stress, between traces 2125, the memory cell of trace 2120 experiences worse retention than the memory cell of trace 2110; also, between traces 2145, the memory cell of trace 2140 experiences worse retention than the memory cell of trace 2130.

Figure 22:
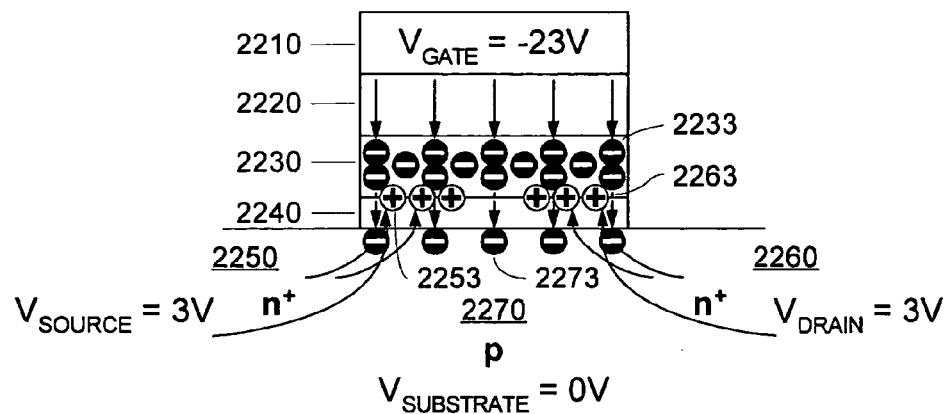
FIG. 22 is a simplified diagram of a charge trapping memory cell with a hybrid bias that simultaneously lowers the threshold voltage of the memory cell and changes the distribution of charge in the charge trapping layer.

FIG. 22 is a simplified diagram of a charge trapping memory cell with a hybrid bias erase procedure, that lowers the threshold voltage of the memory cell by a combination of hot hole injection current and E-field assisted electron injection and ejection current, and balances the distribution of charge in the charge trapping layer. The substrate includes n+ doped regions 2250 and 2260, and a p-doped region 2270 in the substrate between the n+-dopes regions 2250 and 2260. The remainder of the memory cell includes an oxide structure 2240 on the substrate, a charge trapping structure 2230 on the oxide structure 2240, another oxide structure 2220 on the charge trapping structure 2230, and a gate 2210 on the oxide structure 2220. A potential of −21 V is placed on the gate 2210. A potential of 3 V is placed on the source 2250 and the drain 2260. The substrate 2270 is grounded. During this hybrid bias arrangement, multiple charge movements take place. In one charge movement, hot holes move from the source 2250 and the drain 2260 into the charge trapping structure 2230, thereby lowering the threshold voltage of the memory cell. In another charge movement, electrons 2233 move from the gate 2210 to the charge trapping structure 2230. In yet another charge movement, electrons 2273 move from the charge trapping structure 2230 to the source 2250, the substrate 2270, and the drain 2260. Both the movement of electrons 2233 from the gate 2210 to the charge trapping structure 2230 and the movement of electrons 2273 from the charge trapping structure 2230 to the source 2250, the substrate 2270, and the drain 2260 are instances of movement of electrons away from the gate. The potential voltages applied are varied as suited to a particular embodiment, considering dimension of the memory cell and the structure in the memory cell, the material utilized, the target threshold voltages and so on. As mentioned above the electron ejection current from the charge trapping layer to the substrate extends substantially across the length of the channel, and tends to balance the distribution of charge in the charge trapping structure. The hot hole injection current from the substrate near the source and drain regions tends to increase the rate of change of the threshold of the cell, as compared to E-field assisted tunneling alone, so that a faster erase time is achieved.

Figure 23:
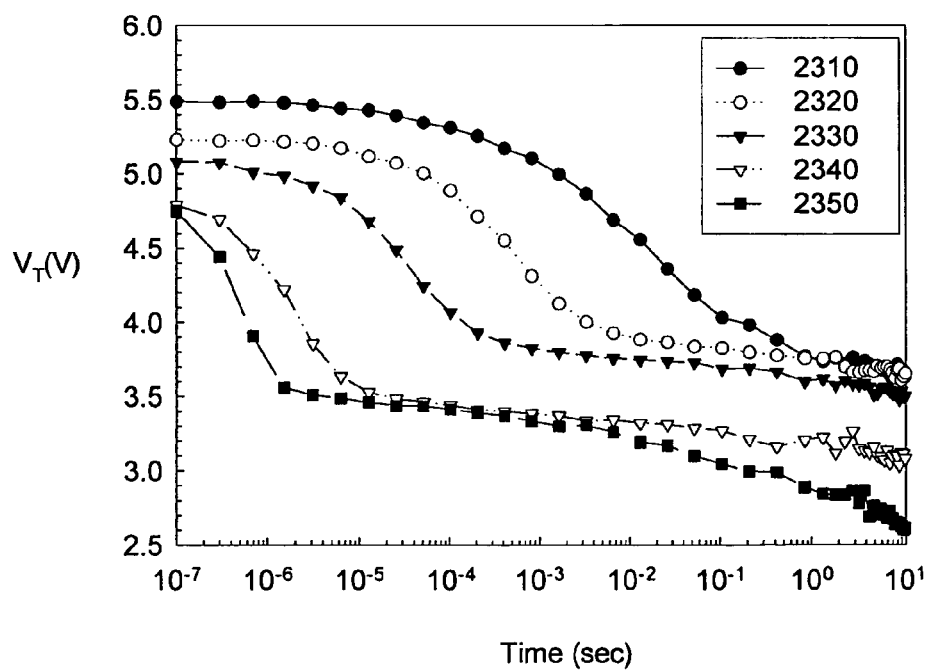
FIG. 23 is a graph of threshold voltage versus time, and compares memory cells with different hybrid biases.

FIG. 23 is a graph of threshold voltage versus time, and compares memory cells with different hybrid biases. A negative gate charge balancing bias, with the source and drain at ground potential, is applied to the memory cell of trace 2310. A hybrid bias that simultaneously lowers the threshold voltage of the memory cell and tends to balance the distribution of charge in the charge trapping layer is applied to the memory cell of traces 2320, 2330, 2340, and 2350. For the memory cell of traces 2310, 2320, 2330, 2340, and 2350, a negative gate voltage of −21 V is applied to the gate and the substrate is grounded. In the memory cell of trace 2310, 0 V is applied to the source and drain. In the memory cell of trace 2320, 2.5 V is applied to the source and drain. In the memory cell of trace 2330, 3 V is applied to the source and drain. In the memory cell of trace 2340, 4 V is applied to the source and drain. In the memory cell of trace 2350, 5 V is applied to the source and drain. FIG. 23 shows that as greater voltages are applied to the source and drain, more holes move from the source and the drain into the charge trapping structure, lowering the threshold voltage more quickly. Thus the hybrid bias that induces hot hole injection current, electron injection current and electron ejection current in combination during the pulse can be used for a faster erase time using shorter erase pulses. Without the hot hole injection current, for example, a pulse on the order of 0.5 to 1.0 seconds is required to establish a threshold voltage convergence in the example cell of FIG. 23. With hot hole injection current, induced by 3 Volts applied symmetrically on the source and drain, the convergence occurs within about 1 to 50 milliseconds in the example cell of FIG. 23. Other embodiments apply a higher magnitude gate voltage to decrease time required to saturate the threshold voltage to the convergence voltage, or apply a lower magnitude gate voltage to increase the time required to saturate the threshold voltage to the convergence voltage. Other embodiments increase or decrease the duration of applying the negative gate voltage, to change the degree to which the threshold voltage approaches the convergence voltage. Other embodiments change the source and drain voltages to change the amount of time taken to lower the threshold voltage of the memory cell.

Figure 24:
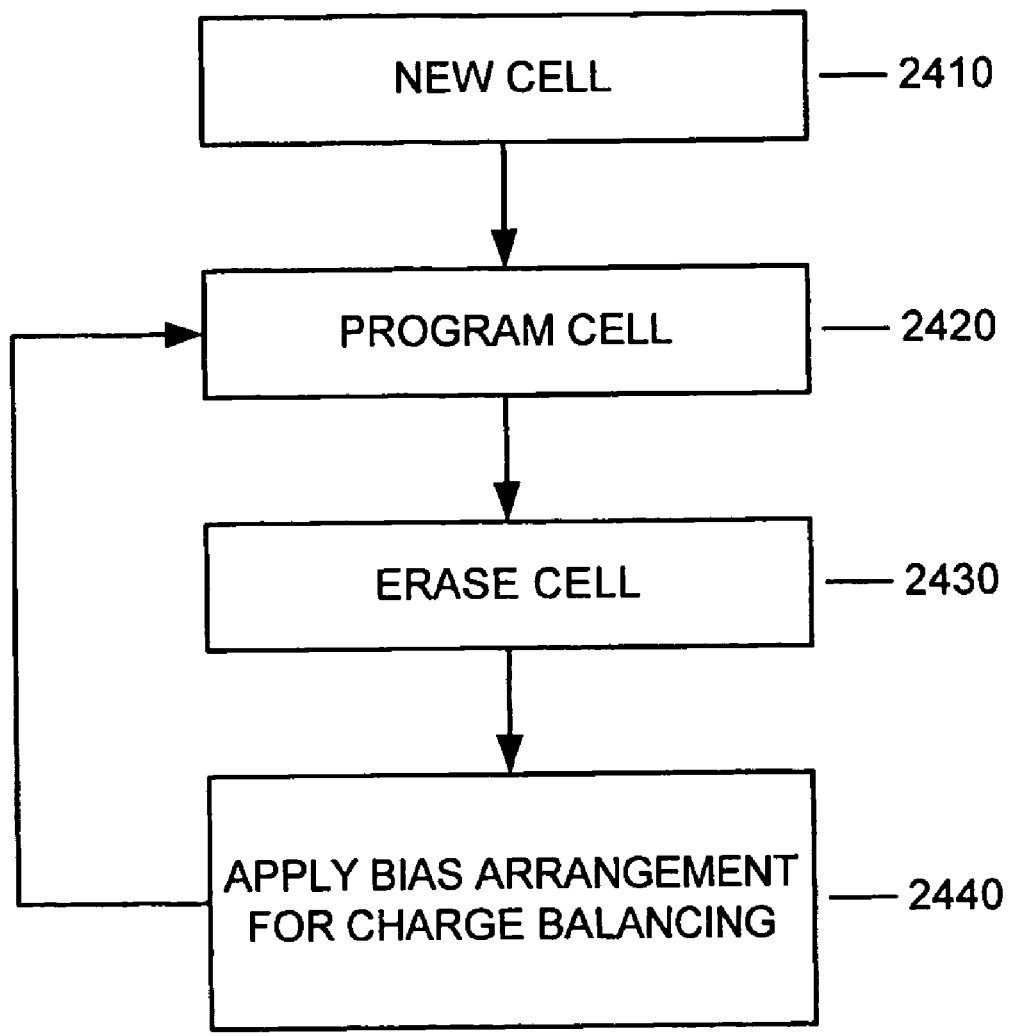
FIGS. 24 and 25 illustrate representative processes for operating a memory cell by changing the distribution of charge in the charge trapping layer before and after lowering the threshold voltage of the memory cell.
Figure 25:
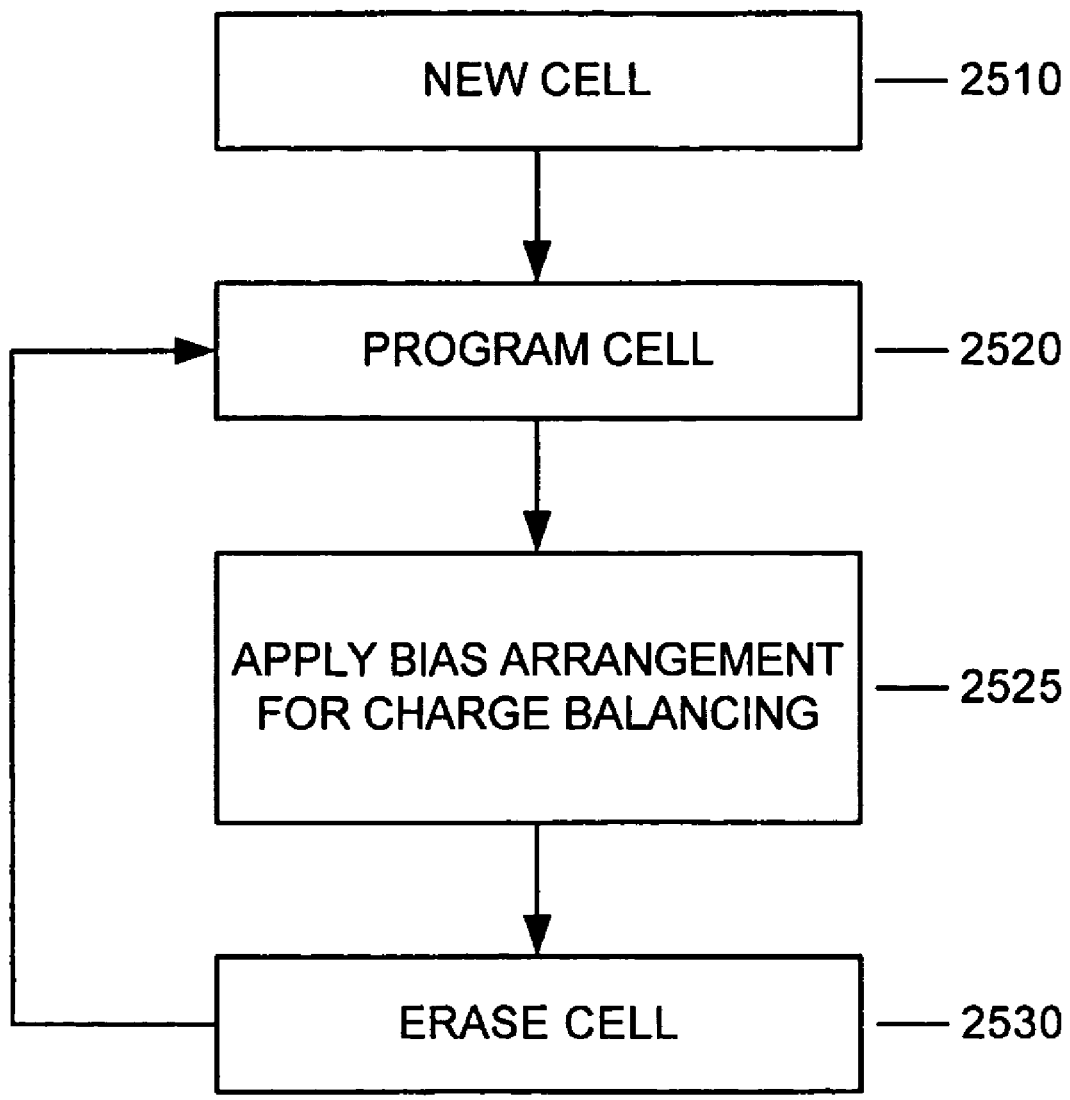

FIGS. 24 and 25 illustrate representative processes for operating a charge trapping memory cell by changing, and tending to balance, the distribution of charge in the charge trapping layer before and after lowering the threshold voltage of the memory cell.

The representative process of FIG. 24 starts with a new cell 2410 that has not yet experienced any program and erase cycles. In 2420 and 2430, the memory cell is programmed and erased. In some embodiments, prior to the first program and erase cycle, an operation that tends to balance the charge distribution of the charge trapping layer is performed. In 2440, after the program and erase cycle, an operation that tends to balance the distribution of charge in the charge trapping layer is performed. Afterwards, the process repeats with another program and erase cycle. Thus, in the representative process of FIG. 24, an operation that tends to balance the distribution of charge in the charge trapping layer is performed after one program and erase cycle. In some embodiments, the operation that that tends to balance the distribution of charge in the charge trapping layer is performed after every program and erase cycle.

The representative process of FIG. 23 is similar to that of FIG. 24. The representative process of FIG. 25 also starts with a new cell 2510 that has not yet experienced any program and erase cycles. However, the operation to change and tending to balance the distribution of charge in the charge trapping layer 2525 occurs between programming the memory cell 2520 and erasing the memory cell 2530, instead of after erasing the memory cell 2520. In some embodiments, prior to the first program and erase cycle, an operation to change and tending to balance the charge distribution of the charge trapping layer is performed.

Figure 26:
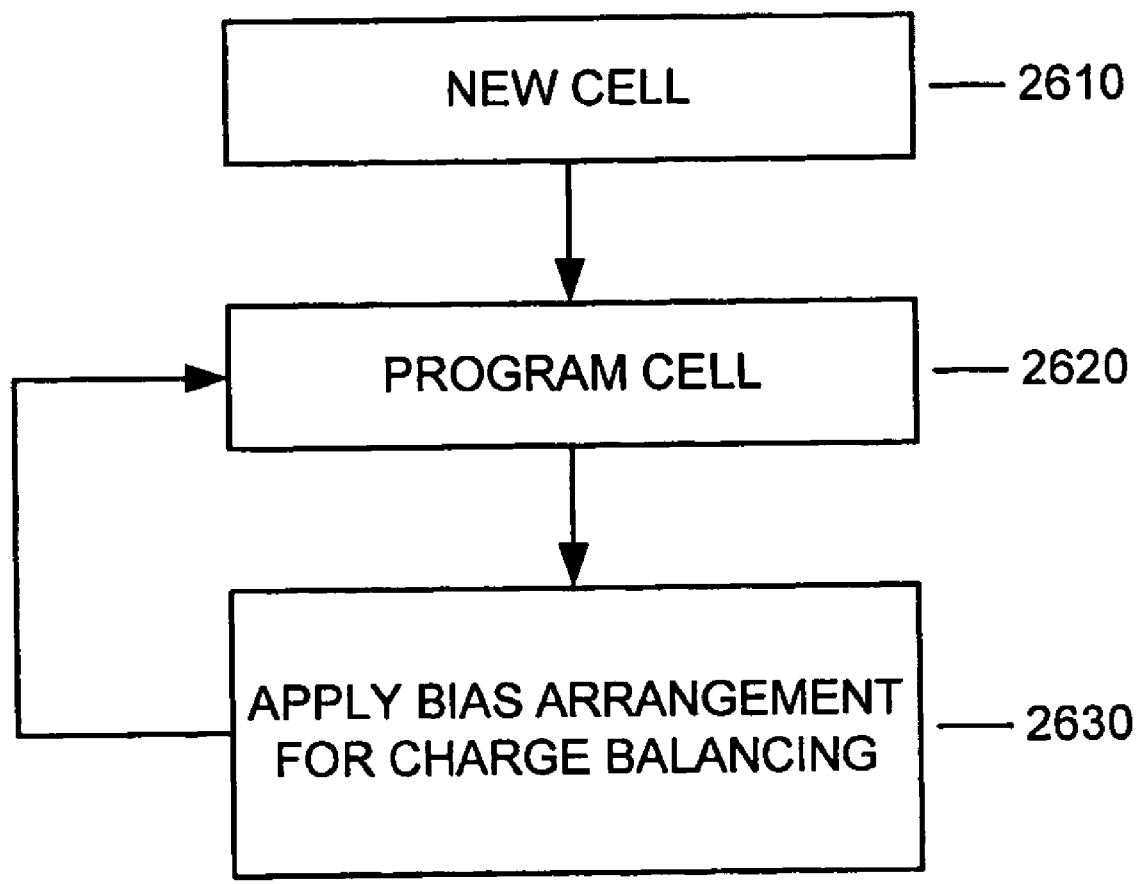
FIG. 26 illustrates a representative process for operating a memory cell by applying a hybrid bias that simultaneously changes the distribution of charge in the charge trapping layer while lowering the threshold voltage of the memory cell.

FIG. 26 illustrates a representative process for operating a charge trapping memory cell by applying a hybrid bias that simultaneously changes the distribution of charge in the charge trapping layer while lowering the threshold voltage of the memory cell. The representative process of FIG. 26 also starts with a new cell 2610 that has not yet experienced any program and erase cycles. In 2620, the memory cell is programmed. In 2630, following the program operation, a hybrid bias is applied to the memory cell. The hybrid bias simultaneously lowers the threshold voltage of the memory cell and changes the distribution of charge in the charge trapping layer. In some embodiments, prior to the first program and erase cycle, an operation to change the charge distribution of the charge trapping layer is performed.

In some embodiments, parts of the representative processes of FIGS. 24, 25, and 26 are combined. In one embodiment, the distribution of charge in the memory cell is changed both prior to and after erasing the memory cell. In various embodiments, the hybrid bias is applied to the memory cell before or after erasing the memory cell. In yet another embodiment, the distribution of charge in the memory cell is changed both prior to and after applying the hybrid bias to the memory cell.

A new erase method of charge trapping memory devices (such as NROM or SONOS devices) is proposed. The device is first "reset" by gate injection (−Vg) to an erase state. Programming can be done by many methods such as channel hot electrons (CHE), channel initiated secondary hot electron (CHISEL) injection, FN tunneling, pulse agitated substrate hot electron (PASHEI) or other procedures. Erase is carried out by band-to-band tunneling enhanced hot hole (BTBTHH) injection (such as typically used in NROM devices), negative FN tunneling as applied in SONOS devices, or otherwise, and applied as sector erase operation. During the sector erase operation, an additional channel erase operation (with negative gate voltage, positive substrate voltage, or a both) is applied, which channel erase operation tends to balance the distribution of charge in the charge trapping structure. This channel erase method offers a self-convergent erase mechanism. It serves as a charge balancing method compensating for both the over-erase cell and for the hard-to-erase cell simultaneously. By means of this charge balancing technique, the distribution of the erase state target threshold voltage Vt can be tightened. Moreover, hole traps in the oxide or nitride can be neutralized by electrons ejected from the gate. Thus, the charge balancing method also reduces hot hole introduced damage to the memory cell. Therefore good endurance and reliability properties can be obtained by combining the charge balancing technology with the hot hole erase method.

The charge balancing/erase operation can be applied in any time or arbitrary sequence during the sector erase operation to improve the erase performance. An alternative method is to turn on the junction bias slightly and introduce hot hole injection during channel erase, which means that the channel erase and hot hole erase happen simultaneously. The combination of hot hole erase and channel erase offers improved P/E window and reliability properties.

Figure 27:
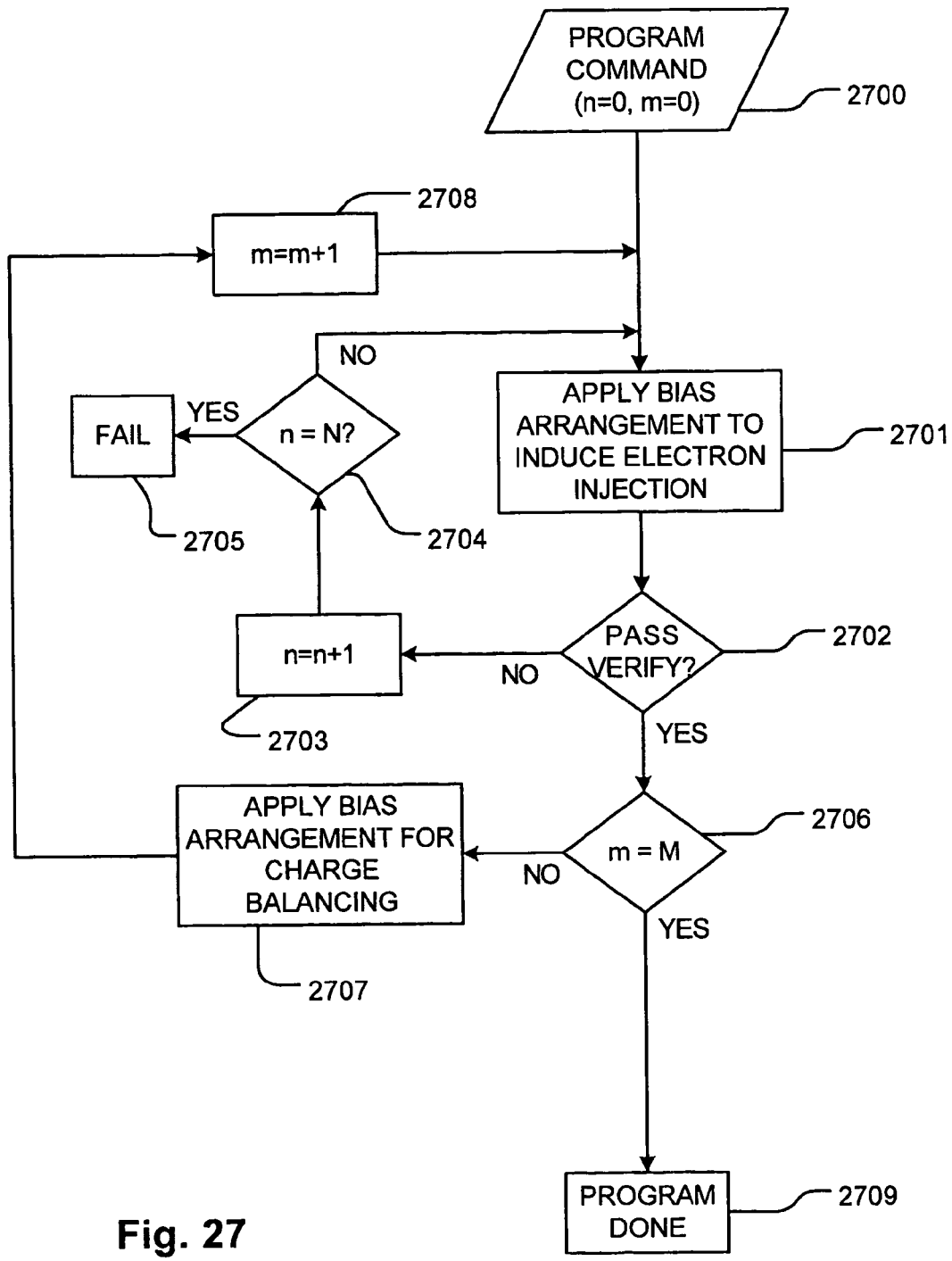
FIG. 27 is a flow chart for a program operation with refill cycles according to embodiments of the described technology.

The charge balancing/erase method described herein can be applied to NROM-like devices with bottom oxides thick enough to deter charge leakage. The charge balancing/erase characteristic shows a consistent trend with respect to various channel lengths which had only initial Vt difference due to the Vt roll-off effect. Since the negative gate FN channel tunneling used for the charge balancing operation is a one-dimensional tunneling mechanism, and substantially symmetrical across the channel, it does not depend on the size of lateral dimension of the cell. Thus, applying the charge balancing/erase method described herein, scalability in the critical dimensions and improved reliability and endurance are achieved for NROM-type devices. The technology is applied in combination with a program procedure, or other procedure adapted to establish a high threshold state in the memory cell, as illustrated in FIG. 27. The procedure includes re-fill operations, in which the cell is first biased to induce a high threshold state, and then a charge balancing pulse is applied tending to lower the threshold by causing ejection of electrons from shallow traps in the charge trapping structure, and then the charge trapping structure is "re-filled" with negative charge by a second pulse to induce electron injection into the charge trapping structure. In FIG. 27, a program procedure is initiated by a program command (block 2700). Heuristically at this point, an index n is set to zero for use in the program retry procedure, and an index m is set to zero for use in counting the refill procedure. The program command in some implementations corresponds with a byte operation typical for flash memory devices in the art. In response to the program command, a biasing procedure is instituted. In one embodiment, the first operation in the biasing procedure is to apply a bias arrangement that induces electron injection memory cells subject of the program operation (block 2701). For example, channel initiated secondary electron injection is induced in a first bias arrangement. This induces electron injection on one side of the charge trapping structure in the cells being programmed. After applying the electron injection bias arrangement, a state machine or other logic determines whether the program operation has been successful for each cell using a program verify operation. Thus, in the next step, the algorithm determines whether the memory cells passed the verify operation (block 2702). If the cell does not pass verify, then the index n is incremented (block 2703), and the algorithm determines whether the index has reached a pre-specified maximum number N of retries (block 2704). If the maximum number of retries has been executed without passing verify, then the procedure fails (block 2705). If the maximum number of retries has not been executed at block 2704, then the procedure returns to block 2701 to retry the electron injection bias arrangement. If at block 2702, the memory cell passes verify, then the algorithm determines whether the specified number of refill cycles has been executed by determining whether the index m has reached its maximum M (block 2706). If the index m is not equal to M, then a charge balancing pulse adapted for the refill algorithm, which causes electron ejection current favoring ejection of electrons in shallow traps first, and as described above with reference to FIG. 1B, is applied (block 2707). The charge balancing biasing operation includes a negative gate voltage pulse having a length less than about 10 milliseconds, and for example about 1 millisecond. Such a pulse tends to cause electrons in shallow energy traps to be ejected into the channel. Very little, if any, electron injection is induced because the cell has a relatively high concentration of negative charge during the re-fill cycle. After the charge balancing biasing operation, the algorithm increments the index m (block 2708), and returns two reapply the bias arrangement that induces electron injection at block 2701. If the memory cell has undergone the prespecified number of refill operations, then the algorithm is finished (block 2709).

Embodiments of the technology include a charge balancing pulse as described with reference to FIG. 27 to be applied prior to any program and erase cycles on the device, or prior to a programming operation as described with reference to FIG. 27. Also, embodiments of the technology include executing the algorithm shown in FIGS. 4, 5, 11, and 24–26 described above including a re-fill procedure, such as that described with reference to FIG. 27, during the program operation.

Figure 28:
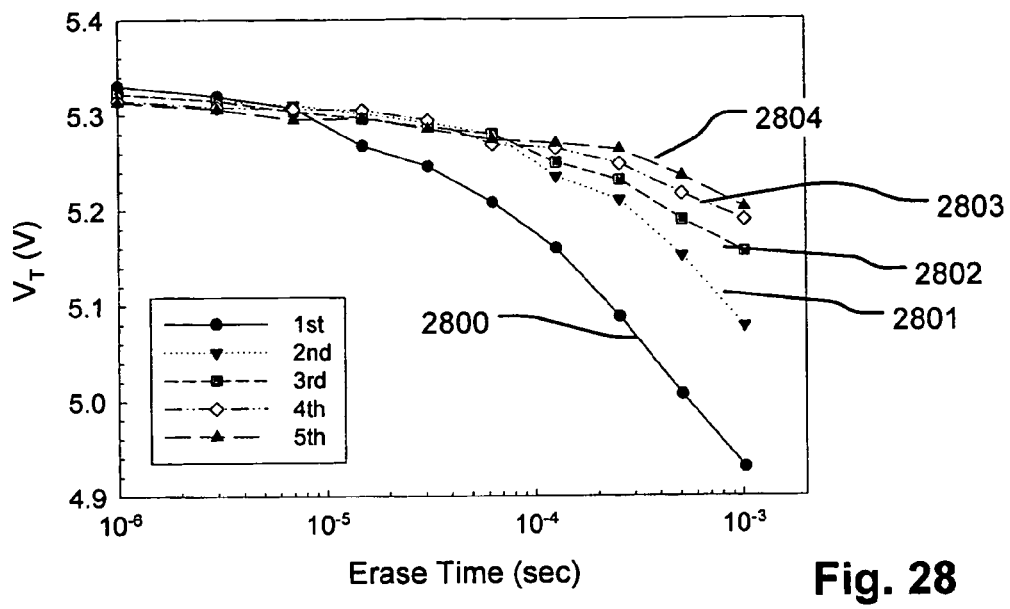
FIG. 28 is a graph of threshold voltage versus erase time for a charge balancing pulse for one embodiment of a program operation with refill cycles.
Figure 29:
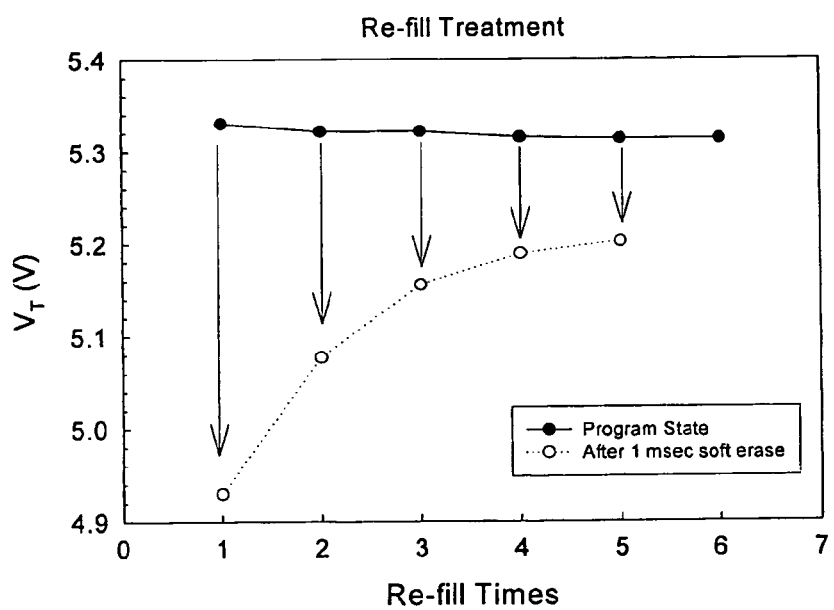
FIG. 29 is a graph of threshold voltage versus refill cycle for the embodiment of a program operation used for the data in FIG. 28.

FIG. 28 and FIG. 29 are graphs showing data illustrating operation of the refill operation of FIG. 27, where the program bias arrangement induces channel initiated secondary electron CHISEL injection current. The data was generated by first performing a charge balancing pulse (gate voltage at −21 volts, with the drain, source and substrate at zero volts for about one second) on a NROM-like memory cell with a p-type polysilicon gate, to establish a threshold voltage of about 3.8 volts. Next, a number of refill cycles were applied. Each refill cycle included applying a bias arrangement causing CHISEL injection current to set the threshold of the memory cell to about 5.3 volts, followed by a short charge balancing pulse (gate voltage at −21 volts, with the drain, source and substrate at zero volts for about one (1) millisecond.

FIG. 28 is a graph of threshold voltage versus time for five charge balancing pulses during the successive cycles of the refill operation. The threshold voltage after a first one millisecond charge balancing pulse on trace 2800 drops from about 5.3 volts to about 4.9 volts. In the next refill cycle on trace 2801, the threshold voltage after a second one millisecond charge balancing pulse drops from about 5.3 volts to about 5.1 volts. In the third refill cycle on trace 2802, the threshold voltage after a third one millisecond charge balancing pulse drops to about 5.3 volts to about 5.2 volts. In the fourth refill cycle on trace 2803, the threshold voltage drops after a fourth one millisecond charge balancing pulse to about 5.3 volts to about 5.22 volts. In the fifth refill cycle on trace 2804, the threshold voltage drops after a fifth one millisecond charge balancing pulse to about 5.3 volts to about 5.23 volts.

FIG. 29 the graph of the same data shown in FIG. 28, illustrating the drop in threshold voltage for each is successive refill cycle. Thus, during a first refill cycle, the threshold voltage drops from about 5.3 volts to about 4.9 volts. In the second refill cycle, the threshold voltage drops to about 5.1 volts. By the fifth refill cycle, the threshold voltage change during the charge balancing pulse of the refill cycle begins to saturate because of the spectrum blue shift of the energy states of the trapped electrons, so that charge loss during the short charge balancing pulse decreases.

Figure 30:
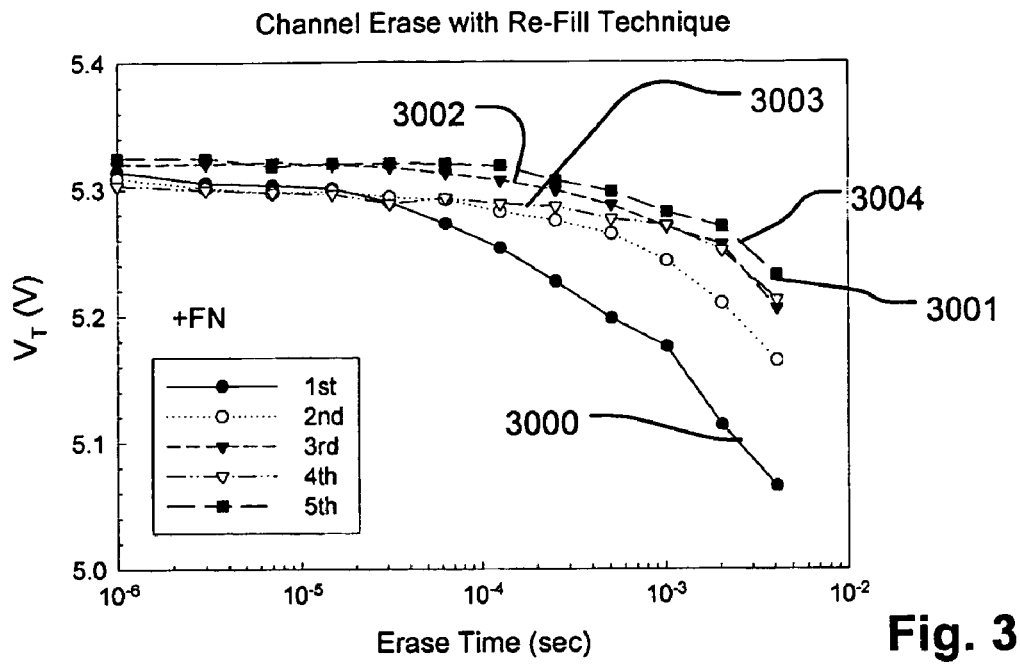
FIG. 30 is a graph of threshold voltage versus erase time for a charge balancing pulse for one embodiment of a program operation with refill cycles.
Figure 31:
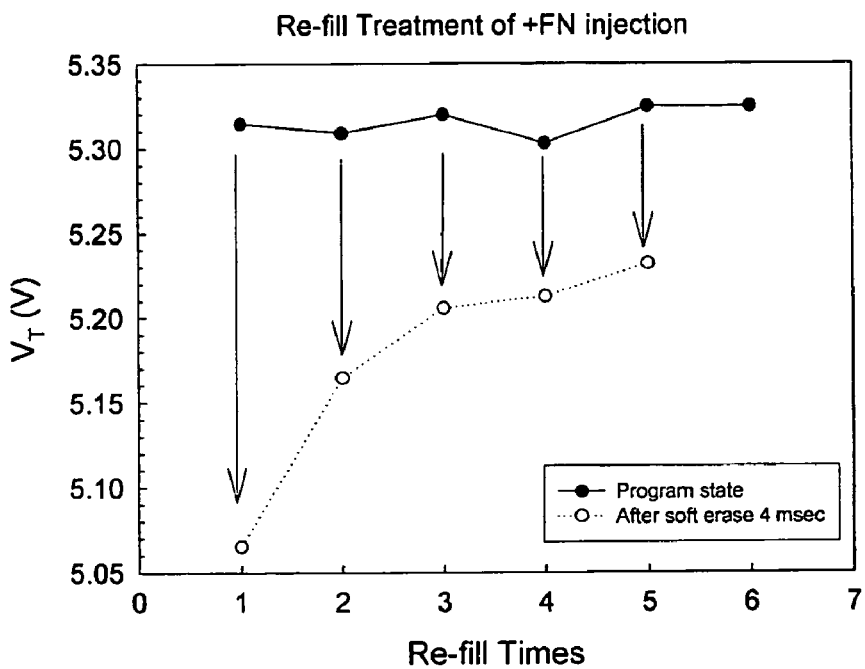
FIG. 31 is a graph of threshold voltage versus refill cycle for the embodiment of a program operation used for the data in FIG. 30.

FIG. 30 and FIG. 31 are graphs showing data illustrating operation of the refill operation of FIG. 27, where the program bias arrangement induces channel FN tunneling current with a positive gate voltage injection current. The data was generated by first performing a charge balancing pulse (gate voltage at −21 volts, with the drain, source and substrate at zero volts for about one second) on a NROM-like memory cell with a p-type polysilicon gate, to establish a threshold voltage of about 3.8 volts. Next, a number of refill cycles were applied. Each refill cycle included applying a bias arrangement causing channel FN tunneling current to set the threshold of the memory cell to about 5.3 volts, followed by a short charge balancing pulse (gate voltage at −21 volts, with the drain, source and substrate at zero volts for about four (4) milliseconds.

FIG. 30 is a graph of threshold voltage versus time for five charge balancing pulses during the successive cycles of the refill operation. The threshold voltage after a first four millisecond charge balancing pulse on trace 2800 drops from about 5.3 volts to about 5.05 volts. In the next refill cycle on trace 2801, the threshold voltage after a second four millisecond charge balancing pulse drops from about 5.3 volts to about 5.16 volts. In the third refill cycle on trace 2802, the threshold voltage after a third four millisecond charge balancing pulse drops to about 5.3 volts to about 5.22 volts. In the fourth refill cycle on trace 2803, the threshold voltage drops after a fourth one millisecond charge balancing pulse to about 5.3 volts to about 5.22 volts. In the fifth refill cycle on trace 2804, the threshold voltage drops after a fifth one millisecond charge balancing pulse to about 5.3 volts to about 5.25 volts.

FIG. 31 the graph of the same data shown in FIG. 31, illustrating the drop in threshold voltage for each is successive refill cycle. Thus, during a first refill cycle, the threshold voltage drops from about 5.3 volts to about 5.05 volts. In the second refill cycle, the threshold voltage drops to about 5.16 volts. By the fifth refill cycle, the threshold voltage change during the charge balancing pulse of the refill cycle begins to saturate because of the spectrum blue shift of the energy states of the trapped electrons, so that charge loss during the short charge balancing pulse decreases.

Figure 32:
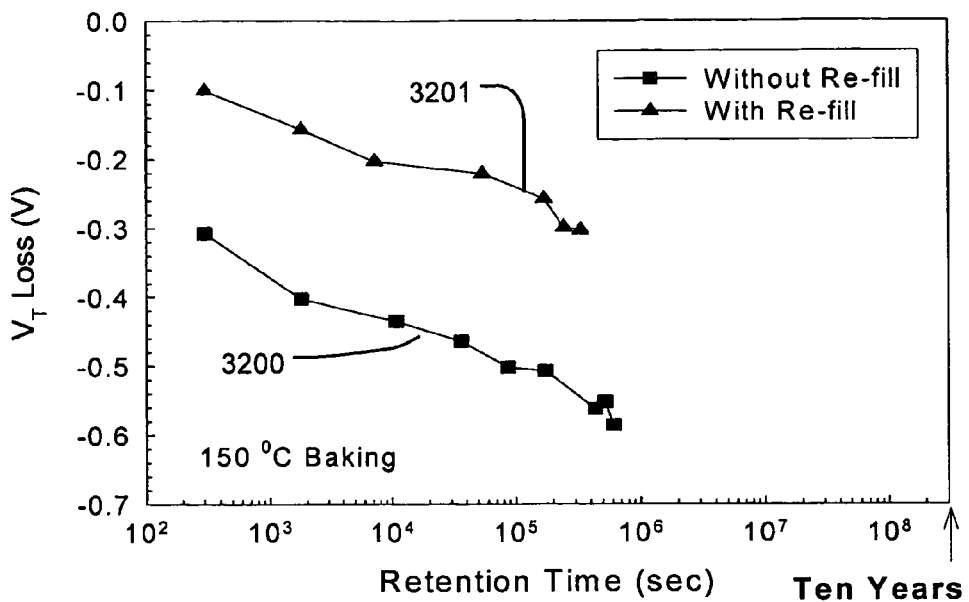
FIG. 32 is a graph illustrating data retention characteristics for a device programmed using refill operations, and a device programmed without refill operations.

FIG. 32 illustrates retention data for cells having the refill treatment and without the refill treatment. The data represents the performance of the device after experiencing 10,000 program and erase cycles, with the resulting hot hole damage. In a device without refill as illustrated on trace 3200, threshold loss exceeds 0.5 volts after baking time at about 150 degrees C., corresponds with about one million seconds of retention time. In a device with refill as illustrated on trace 3201, threshold loss is is less than 0.3 volts over the same baking time.

Figure 33:
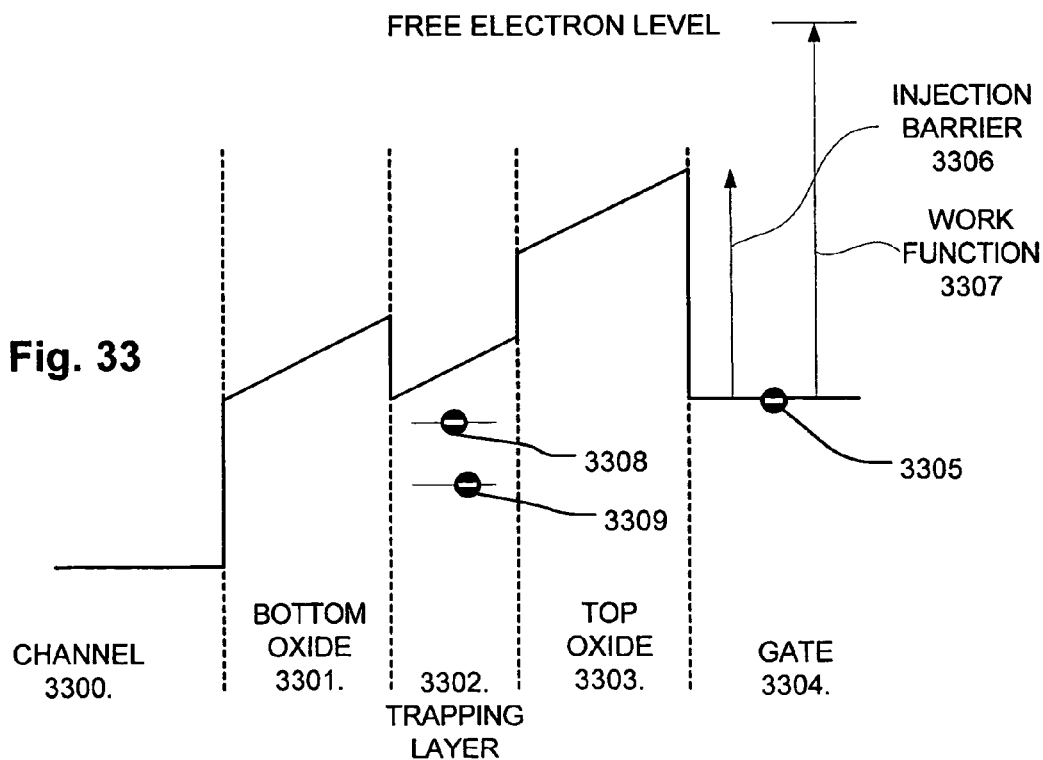
FIG. 33 is a simplified energy level diagram for a charge trapping memory cell illustrating concepts applied in the present description.

FIG. 33 is a simplified energy level diagram for a charge trapping memory cell, which illustrates concepts related to the present technology. In that in the level diagram, a first region 3300 corresponds with the channel in the substrate. A second region 3301 corresponds with the bottom dielectric, typically comprising silicon dioxide. A third region 3302 corresponds with the charge trapping layer, typically comprising silicon nitride. A fourth region 3303 corresponds with the top dielectric, typically comprising silicon dioxide. A fifth region 3304 corresponds with the gate, comprising p-type polysilicon or other relatively high work function material in embodiments of the present technology. As mentioned above, a relatively high work function material is used in the gate so that the injection barrier 3306 for an electron 3305 is higher than that for an n-type polysilicon gate with silicon dioxide top dielectric. The work function 3307 as illustrated in FIG. 33 corresponds with the amount of energy the to move an electron from the conduction band of the gate material to a free electron level. FIG. 33 also illustrates shallow and deep traps for electrons 3308 and 3309, respectively, in the charge trapping layer. A short charge balancing pulse as described above with reference to FIG. 27 tends to cause ejection of electrons 3308 in a shallow trap, before ejection of electrons 3309 in a deeper trap. Electrons 3309 in the deeper trap are more resistant to charge leakage and demonstrate better charge retention characteristics. For embodiments applying the refill operation, is preferred that the bottom oxide the greater than three nanometers thick to inhibit direct tunneling. Also, the materials for the top and bottom dielectrics can be other high dielectric constant materials, including for example $Al_2O_3$ and $HfO_2$. Likewise, other materials can be utilized for the charge trapping structure.

The negative charge balancing operation possesses a self-convergent threshold voltage property which maintains a stable distribution of threshold voltages over an array and over a large number of program and erase cycles. Furthermore, excellent reliability properties are achieved due to reduced hot hole damage in the bottom dielectric.

While the present invention is disclosed by reference to the technology and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a memory cell having a threshold voltage and comprising a charge trapping structure, the method comprising:
    lowering the threshold voltage of the memory cell via a first bias arrangement and raising the threshold voltage of the memory cell via a second bias arrangement; and
    after an interval within which a plurality of threshold voltage raising and lowering cycles occurs or is likely to occur, applying a third bias arrangement tending to balance a distribution of charge in the charge trapping structure.

2. The method of claim 1, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness greater than 3 nanometers, and the third bias arrangement includes applying a negative voltage from the gate of the memory cell to the substrate in the region of the channel having a magnitude of about 0.7 or higher volts per nanometer of the combined effective oxide thickness.

3. The method of claim 1, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness greater than 3 nanometers, and the third bias arrangement includes applying a negative voltage on the gate of the memory cell having a magnitude of about 0.7 or higher volts per nanometer of the combined effective oxide thickness, while applying near ground potential to the substrate in the region of the channel and applying near ground potential to the source and drain.

4. The method of claim 1, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness about 3 nanometers or less, and the third bias arrangement includes applying a negative voltage from the gate of the memory cell to the substrate in the region of the channel having a magnitude of about 0.3 or higher volts per nanometer of the combined effective oxide thickness.

5. The method of claim 1, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness about 3 nanometers or less, and the third bias arrangement includes applying a negative voltage on the gate of the memory cell having a magnitude of about 0.3 or higher volts per nanometer of the combined effective oxide thickness, while applying near ground potential to the substrate in the region of the channel and applying near ground potential to the source and drain.

6. The method of claim 1, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the third bias arrangement includes applying a negative voltage from the gate of the memory cell to the substrate in the region of the channel of the memory cell having a magnitude of 1.0 plus or minus about 10% volts per nanometer of the combined effective oxide thickness.

7. The method of claim 1, wherein the interval is determined by a timer.

8. The method of claim 1, wherein the interval is determined by counting a number of threshold voltage raising and lowering cycles.

9. The method of claim 1, wherein the interval ends after a random number of threshold voltage raising and lowering cycles.

10. The method of claim 1, wherein the interval ends when the memory cell fails to lower the threshold voltage.

11. The method of claim 1, wherein the interval includes a time between power up events of a machine including the memory cell.

12. The method of claim 1, wherein changing the distribution of charge includes removing excess charge from the charge trapping structure.

13. The method of claim 1, wherein changing the distribution of charge includes adding charge to the charge trapping structure.

14. The method of claim 1, wherein a plurality of threshold voltage raising and lowering cycles leaves a distribution of charge in the charge trapping structure which acts as an interference with a minimum threshold voltage achievable in the memory cell via at least one of the first bias arrangement and the second bias arrangement, and the interference results in the minimum threshold voltage achievable exceeding an erase verify voltage of the memory cell, and changing the distribution of charge results in the minimum threshold voltage achievable being less than an erase verify voltage of the memory cell.

15. The method of claim 1, further comprising:
    prior to any threshold voltage raising and lowering cycles, applying a pulse to the memory cell according to the third bias arrangement.

16. The method of claim 1, wherein the third bias arrangement causes E-field assisted tunneling of electrons from the charge trapping structure to a substrate of the memory cell and E-field assisted tunneling of electrons from a gate of the memory cell.

17. The method of claim 1, wherein the first bias arrangement causes hot hole injection, the second bias arrangement causes hot electron injection, and the third bias arrangement places a gate of the memory cell at a negative potential leading to change balance state.

18. The method of claim 1, wherein the first bias arrangement causes hot hole injection, the second bias arrangement causes E-field assist tunneling of electrons from the substrate, and the third bias arrangement places a gate of the memory cell at a negative potential leading to an equilibrium in the amount of charge in the charge trapping layer.

19. The method of claim 1, wherein the first bias arrangement causes E-field assist tunneling of holes, the second bias arrangement causes E-field assist tunneling of electrons from the substrate, and the third bias arrangement places a gate of the memory cell at a negative potential leading to an equilibrium in the amount of charge in the charge trapping layer.

20. The method of claim 1, including applying the third bias arrangement for an interval long enough to substantially establish an equilibrium in the amount of charge in the charge trapping layer.

21. The method of claim 1, including applying the third bias arrangement for an interval longer than about 100 milliseconds.

22. The method of claim 1, including applying the third bias arrangement for an interval longer than about 500 milliseconds.

23. The method of claim 1, including applying the third bias arrangement for an interval longer than about 1 second.

24. The method of claim 1, wherein the first bias arrangement causes hot hole injection in a first region closer to one side of the channel, the second bias arrangement causes hot electron injection in a second region closer to the one side of the channel that overlaps with the first region, and the third biasing causes E-field assisted tunneling in a third region extending across the channel and overlapping with the first and second regions.

25. The method of claim 1, wherein the first bias arrangement causes hot hole injection in a first region closer to one side of the channel, the second bias arrangement causes E-field assist tunneling of electrons across the channel that overlaps with the first region, and the third biasing causes E-field assisted tunneling in a third region extending across the channel and overlapping with the first region.

26. The method of claim 1, wherein the first bias arrangement causes E-field assist tunneling of holes across the channel, the second bias arrangement causes E-field assist tunneling of electrons across the channel, and the third biasing causes E-field assisted tunneling across the channel.

27. An integrated circuit device comprising:
a semiconductor substrate;
a plurality of memory cells on the substrate, each memory cell of the plurality of memory cells having a threshold voltage and comprising a charge trapping structure; and
controller circuitry coupled to the plurality of memory cells, including logic to lower the threshold voltage via a first bias arrangement, logic to raise the threshold voltage via a second bias arrangement, and logic to change a distribution of charge in the charge trapping structure via a third bias arrangement at least after an interval within which a plurality of threshold voltage raising and lowering cycles occurs or is likely to occur.

28. The device of claim 27, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness greater than 3 nanometers, and the third bias arrangement includes a negative voltage from the gate of the memory cell to the substrate in the region of the channel having a magnitude of about 0.7 or higher volts per nanometer of the combined effective oxide thickness.

29. The device of claim 27, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness greater than 3 nanometers, and the third bias arrangement includes a negative voltage on the gate of the memory cell having a magnitude of about 0.7 or higher volts per nanometer of the combined effective oxide thickness, while applying near ground potential to the substrate in the region of the channel and applying near ground potential to the source and drain.

30. The device of claim 27, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness about 3 nanometers or less, and the third bias arrangement includes a negative voltage from the gate of the memory cell to the substrate in the region of the channel having a magnitude of about 0.3 or higher volts per nanometer of the combined effective oxide thickness.

31. The device of claim 27, wherein the memory cell comprises a gate, source and drain regions in a substrate region, and a channel in the substrate between the source and drain regions, and including atop dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness about 3 nanometers or less, and the third bias arrangement includes a negative voltage on the gate of the memory cell having a magnitude of about 0.3 or higher volts per nanometer of the combined effective oxide thickness, while applying near ground potential to the substrate in the region of the channel and applying near ground potential to the source and drain.

32. The device of claim 27, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the third bias arrangement includes a negative voltage from the gate of the memory cell to the substrate in the region of the channel having a magnitude of about 1.0 plus or minus about 10% volts per nanometer of the combined effective oxide thickness.

33. The device of claim 27, including a timer, and logic to determine the interval using the timer.

34. The device of claim 27, including a program and erase cycle counter, and logic to determine the interval is determined by counting a number of threshold voltage raising and lowering cycles.

35. The device of claim 27, wherein the interval ends after a random number of threshold voltage raising and lowering cycles.

36. The device of claim 27, including logic to apply the third bias arrangement after an interval that ends when the memory cell fails to lower the threshold voltage.

37. The device of claim 27, including logic to apply the third bias arrangement after an interval that ends upon power up events of the device.

38. The device of claim 27, including logic to apply the third bias arrangement, prior to any threshold voltage raising and lowering cycles.

39. The device of claim 27, wherein the third bias arrangement causes E-field assisted tunneling of electrons from the charge trapping structure to a substrate of the memory cell and E-field assisted tunneling of electrons from a gate of the memory cell.

40. The device of claim 27, wherein the third bias arrangement causes E-field assisted tunneling of electrons from a gate of the memory cell.

41. The device of claim 27, wherein the first bias arrangement causes hot hole injection, the second bias arrangement causes hot electron injection, and the third bias arrangement places a gate of the memory cell at a negative potential leading to an equilibrium in the amount of charge in the charge trapping layer.

42. The method of claim 27, wherein the first bias arrangement causes hot hole injection, the second bias arrangement causes E-field assist tunneling of electrons from the substrate, and the third bias arrangement places a gate of the memory cell at a negative potential leading to an equilibrium in the amount of charge in the charge trapping layer.

43. The method of claim 27, wherein the first bias arrangement causes E-field assist tunneling of holes, the second bias arrangement causes E-field assist tunneling of electrons from the substrate, and the third bias arrangement places a gate of the memory cell at a negative potential leading to an equilibrium in the amount of charge in the charge trapping layer.

44. The device of claim 27, wherein the logic applies the third bias arrangement for an interval long enough to substantially establish an equilibrium in the amount of charge in the charge trapping layer.

45. The device of claim 27, wherein the logic applies the third bias arrangement for an interval longer than about 100 milliseconds.

46. The device of claim 27, wherein the logic applies the third bias arrangement for an interval longer than about 500 milliseconds.

47. The device of claim 27, wherein the logic applies the third bias arrangement for an interval longer than about 1 second.

48. The device of claim 27, wherein the first bias arrangement causes hot hole injection in a first region closer to one side of the channel, the second bias arrangement causes hot electron injection in a second region closer to the one side of the channel that overlaps with the first region, and the third biasing causes E-field assisted tunneling in a third region extending across the channel and overlapping with the first and second regions.

49. The method of claim 27, wherein the first bias arrangement causes hot hole injection in a first region closer to one side of the channel, the second bias arrangement causes E-field assist tunneling of electrons across the channel that overlaps with the first region, and the third biasing causes E-field assisted tunneling in a third region extending across the channel and overlapping with the first region.

50. The method of claim 27, wherein the first bias arrangement causes E-field assist tunneling of holes across the channel, the second bias arrangement causes E-field assist tunneling of electrons across the channel, and the third biasing causes E-field assisted tunneling across the channel.

51. A method of preparing a threshold voltage of a memory cell for operation, the memory cell comprising a charge trapping structure, the method comprising:

prior to any lowering of the threshold voltage of the memory cell via a first bias arrangement of the memory cell and any raising of the threshold voltage of the memory cell via a second bias arrangement of the memory cell, adding charge to the charge trapping structure via a third bias arrangement of the memory cell.

52. The method of claim 51, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness greater than 3 nanometers, and the third bias arrangement includes applying a negative voltage from the gate of the memory cell to the substrate in the region of the channel having a magnitude of about 0.7 or higher volts per nanometer of the combined effective oxide thickness.

53. The method of claim 51, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness greater than 3 nanometers, and the third bias arrangement includes applying a negative voltage on the gate of the memory cell having a magnitude of about 0.7 or higher volts per nanometer of the combined effective oxide thickness, while applying near ground potential to the substrate in the region of the channel and applying near ground potential to the source and drain.

54. The method of claim 51, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness about 3 nanometers or less, and the third bias arrangement includes applying a negative voltage from the gate of the memory cell to the substrate in the region of the channel having a magnitude of about 0.3 or higher volts per nanometer of the combined effective oxide thickness.

55. The method of claim 51, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness about 3 nanometers or less, and the third bias arrangement includes applying a negative voltage on the gate of the memory cell having a magnitude of about 0.3 or higher volts per nanometer of the combined effective oxide thickness, while applying near ground potential to the substrate in the region of the channel and applying near ground potential to the source and drain.

56. The method of claim 51, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the third bias arrangement includes applying a negative voltage from the gate of the memory cell to the substrate in the region of the channel having a magnitude of 1.0 plus or minus about 10% volts per nanometer of the combined effective oxide thickness.

57. The method of claim 51, wherein the third bias arrangement causes E-field assisted tunneling of electrons from the charge trapping structure to a substrate of the memory cell and E-field assisted tunneling of electrons from a gate of the memory cell.

58. The method of claim 51, wherein the first bias arrangement causes hot hole injection, the second bias arrangement causes hot electron injection, and the third bias arrangement places the gate of the memory cell at a negative potential leading to an equilibrium in the amount of charge in the charge trapping layer.

59. The method of claim 51, wherein the first bias arrangement causes hot hole injection, the second bias arrangement causes E-field assist tunneling of electrons from the substrate, and the third bias arrangement places a gate of the memory cell at a negative potential leading to an equilibrium in the amount of charge in the charge trapping layer.

60. The method of claim 51, wherein the first bias arrangement causes E-field assist tunneling of holes, the second bias arrangement causes E-field assist tunneling of electrons from the substrate, and the third bias arrangement places a gate of the memory cell at a negative potential leading to an equilibrium in the amount of charge in the charge trapping layer.

61. The method of claim 51, including applying the third bias arrangement for an interval long enough to substantially establish an equilibrium in the amount of charge in the charge trapping layer.

62. The method of claim 51, including applying the third bias arrangement for an interval longer than about 100 milliseconds.

63. The method of claim 51, including applying the third bias arrangement for an interval longer than about 500 milliseconds.

64. The method of claim 51, including applying the third bias arrangement for an interval longer than about 1 second.

65. The method of claim 1, wherein the first bias arrangement causes hot hole injection in a first region closer to one side of the channel, the second bias arrangement causes hot electron injection in a second region closer to the one side of the channel that overlaps with the first region, and the third biasing causes E-field assisted tunneling in a third region extending across the channel and overlapping with the first and second regions.

66. The method of claim 51, wherein the first bias arrangement causes hot hole injection in a first region closer to one side of the channel, the second bias arrangement causes E-field assist tunneling of electrons across the channel that overlaps with the first region, and the third biasing causes E-field assisted tunneling in a third region extending across the channel and overlapping with the first region.

67. The method of claim 51, wherein the first bias arrangement causes E-field assist tunneling of holes across the channel, the second bias arrangement causes E-field assist tunneling of electrons across the channel, and the third biasing causes E-field assisted tunneling across the channel.

68. An integrated circuit device comprising:
a semiconductor substrate;
a plurality of memory cells on the substrate, each memory cell of the plurality of memory cells having a threshold voltage and comprising a charge trapping structure; and
controller circuitry coupled to the plurality of memory cells, including logic to lower the threshold voltage via a first bias arrangement, logic to raise the threshold voltage via a second bias arrangement, and logic to add charge to the charge trapping structure via a third bias arrangement prior at least to any threshold voltage raising and lowering cycles.

69. The device of claim 68, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness greater than 3 nanometers, and the third bias arrangement includes a negative voltage from the gate of the memory cell to the substrate in the region of the channel having a magnitude of about 0.7 or higher volts per nanometer of the combined effective oxide thickness.

70. The device of claim 68, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness greater than 3 nanometers, and the third bias arrangement includes a negative voltage on the gate of the memory cell having a magnitude of about 0.7 or higher volts per nanometer of the combined effective oxide thickness, while applying near ground potential to the substrate in the region of the channel and applying near ground potential to the source and drain.

71. The device of claim 68, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness about 3 nanometers or less, and the third bias arrangement includes a negative voltage from the gate of the memory cell to the substrate in the region of the channel having a magnitude of about 0.3 or higher volts per nanometer of the combined effective oxide thickness.

72. The device of claim 68, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness about 3 nanometers or less, and the third bias arrangement includes a negative voltage on the gate of the memory cell having a magnitude of about 0.3 or higher volts per nanometer of the combined effective oxide thickness, while applying near ground potential to the substrate in the region of the channel and applying near ground potential to the source and drain.

73. The device of claim 68, wherein the memory cell comprises a gate, source and drain regions in a substrate region, and a channel in the substrate between the source and drain regions, and including a top dielectric, a charge trapping structure, and a bottom dielectric between the gate and the channel, and wherein the top dielectric, the charge trapping structure, and the bottom dielectric have a combined effective oxide thickness, and the bottom dielectric has an effective oxide thickness about 3 nanometers or less, and the third bias arrangement includes a negative voltage from the gate of the memory cell to the substrate in the region of the channel having a magnitude of 1.0 plus or minus about 10% volts per nanometer of the combined effective oxide thickness.

74. The device of claim 68, wherein the third bias arrangement causes E-field assisted tunneling of electrons from the charge trapping structure to a substrate of the memory cell and E-field assisted tunneling of electrons from a gate of the memory cell.

75. The device of claim 68, wherein the first bias arrangement causes hot hole injection and the second bias arrangement causes hot electron injection, and the third bias arrangement causes E-field assisted tunneling of electrons from the charge trapping structure to a substrate of the memory cell and E-field assisted tunneling of electrons from a gate of the memory cell.

76. The device of claim 68, wherein the first bias arrangement causes hot hole injection and the second bias arrangement causes E-field assisted tunneling of electrons, and the third bias arrangement causes E-field assisted tunneling of electrons from the charge trapping structure to a substrate of the memory cell and E-field assisted tunneling of electrons from a gate of the memory cell.

77. The device of claim 68, wherein the first bias arrangement causes E-field assisted tunneling of holes and the second bias arrangement causes E-field assisted tunneling of electrons, and the third bias arrangement causes E-field assisted tunneling of electrons from the charge trapping structure to a substrate of the memory cell and E-field assisted tunneling of electrons from a gate of the memory cell.

78. The device of claim 68, wherein the logic applies the third bias arrangement for an interval long enough to substantially establish an equilibrium in the amount of charge in the charge trapping layer.

79. The device of claim 68, wherein the logic applies the third bias arrangement for an interval longer than about 100 milliseconds.

80. The device of claim 68, wherein the logic applies the third bias arrangement for an interval longer than about 500 milliseconds.

81. The device of claim 68, wherein the logic applies the third bias arrangement for an interval longer than about 1 second.

82. The device of claim 68, wherein the first bias arrangement causes hot hole injection in a first region closer to one side of the channel, the second bias arrangement causes hot electron injection in a second region closer to the one side of the channel that overlaps with the first region, and the third biasing causes E-field assisted tunneling in a third region extending across the channel and overlapping with the first and second regions.

83. The method of claim 68, wherein the first bias arrangement causes hot hole injection in a first region closer to one side of the channel, the second bias arrangement causes E-field assist tunneling of electrons across the channel that overlaps with the first region, and the third biasing causes E-field assisted tunneling in a third region extending across the channel and overlapping with the first region.

84. The method of claim 68, wherein the first bias arrangement causes E-field assist tunneling of holes across the channel, the second bias arrangement causes E-field assist tunneling of electrons across the channel, and the third biasing causes E-field assisted tunneling across the channel.

85. An integrated circuit device comprising:

a substrate;

a plurality of memory cells on the substrate, each memory cell of the plurality of memory cells having a threshold voltage and comprising a gate, and a channel, a source region and a drain region in the substrate, and including a top dielectric, a charge trapping structure, and a bottom dielectric between the gate and the channel; and controller circuitry coupled to the plurality of memory cells, including logic to lower the threshold voltage via a first bias arrangement, logic to raise the threshold voltage via a second bias arrangement, and logic applying a third bias arrangement, and wherein the top dielectric, the charge trapping structure, and the bottom dielectric have a combined effective oxide thickness, and the bottom dielectric has an elective oxide thickness greater than 3 nanometers, and the third bias arrangement includes a negative voltage from the gate of the memory cell to the substrate in the region of the channel having a magnitude of about 0.7 or higher volts per nanometer of the combined effective oxide thickness.

86. An integrated circuit device comprising:

a substrate;

a plurality of memory cells on the substrate, each memory cell of the plurality of memory cells having a threshold voltage and comprising a gate, and a channel, a source region and a drain region in the substrate, and including a top dielectric, a charge trapping structure, and a bottom dielectric between the gate and the channel; and controller circuitry coupled to the plurality of memory cells, including logic to lower the threshold voltage via a first bias arrangement, logic to raise the threshold voltage via a second bias arrangement, and logic applying a third bias arrangement, and wherein the top dielectric, the charge trapping structure, and the bottom dielectric have a combined effective oxide thickness, and the bottom dielectric has an effective oxide thickness about 3 nanometers or less, and the third bias arrangement includes a negative voltage from the gate of the memory cell to the substrate in the region of the channel having a magnitude of about 0.3 or higher volts per nanometer of the combined effective oxide thickness.

* * * * *

UNITED STATES PATENT AND TRADEMARK OFFICE
CERTIFICATE OF CORRECTION

| | | |
|---|---|---|
| PATENT NO. | : 7,133,313 B2 | Page 1 of 1 |
| APPLICATION NO. | : 10/875623 | |
| DATED | : November 7, 2006 | |
| INVENTOR(S) | : Yen-Hao Shih | |

It is certified that error appears in the above-identified patent and that said Letters Patent is hereby corrected as shown below:

Claim 85 at
Column 38,
Line 46: delete "elective" and insert --effective--.

Signed and Sealed this

Sixth Day of February, 2007

JON W. DUDAS
*Director of the United States Patent and Trademark Office*